(12) United States Patent
Schultz

(10) Patent No.: US 6,507,440 B1
(45) Date of Patent: Jan. 14, 2003

(54) COMPONENTS WITH AN ANAMORPHOTIC EFFECT FOR REDUCING AN ASPECT RATIO OF A RASTER ELEMENT IN AN ILLUMINATION SYSTEM

(75) Inventor: Jörg Schultz, Aalen (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 38 days.

(21) Appl. No.: 09/612,611

(22) Filed: Jul. 8, 2000

(30) Foreign Application Priority Data

Jul. 9, 1999 (DE) .......................................... 199 31 848

(51) Int. Cl.$^7$ ............................................. G02B 27/10
(52) U.S. Cl. ..................... 359/626; 359/627; 378/34; 362/326; 362/341
(58) Field of Search .................. 359/619, 626–628, 359/850–852, 867–869; 378/34, 84; 362/326, 336, 338, 341, 347–348

(56) References Cited

U.S. PATENT DOCUMENTS

| 5,222,112 A | 6/1993 | Terasawa et al. ............. 378/34 |
| 5,339,346 A | 8/1994 | White .......................... 378/34 |
| 5,581,605 A | 12/1996 | Murakami et al. ............. 378/84 |
| 5,669,708 A | 9/1997 | Mashima et al. ............. 362/341 |
| 5,677,939 A | 10/1997 | Oshino ......................... 378/34 |
| 5,993,010 A | 11/1999 | Ohzawa et al. ................ 353/99 |
| 6,252,717 B1 * | 6/2001 | Grosskopf .................. 359/619 |
| 6,285,443 B1 * | 9/2001 | Wangler et al. ............... 355/67 |
| 6,285,497 B1 * | 9/2001 | Sweatt et al. ................ 359/351 |

FOREIGN PATENT DOCUMENTS

| EP | 0 939 341 A2 | 9/1999 |
| EP | 1 026 547 A2 | 8/2000 |

* cited by examiner

*Primary Examiner*—Jordan M. Schwartz
(74) *Attorney, Agent, or Firm*—Ohlandt, Greeley, Ruggiero & Perle, L.L.P.

(57) ABSTRACT

There is provided an illumination system for illuminating a field with an aspect ratio other than 1:1 in an image plane. The illumination system includes (a) a light source, and (b) an optical component for transforming the light source into a secondary light source, where the optical component produces an anamorphotic effect that splits the secondary light source into a tangential secondary light source and a sagital secondary light source. The optical component has a first mirror or a first lens, having a raster element. The raster element has an aspect ratio smaller than the aspect ratio of the field in the image plane, and the raster element is imaged into the image plane.

47 Claims, 31 Drawing Sheets

COMPONENTS WITH AN ANAMORPHOTIC EFFECT FOR REDUCING AN ASPECT RATIO OF A RASTER ELEMENT IN AN ILLUMINATION SYSTEM

BACKGROUND OF THE INVENTION

The invention concerns an illumination system, particularly such a system for lithography, thus, for example, VUV and EUV-lithography with wavelengths equal to or less than 193 nm, which illuminates a field with an aspect ratio that is not equal to 1:1, wherein the illumination system comprises at least one light source, one field mirror or one field lens as well as optical components for transforming the light source into secondary light sources.

In order to be able to still further reduce the structural width of microelectronic devices, particularly to the submicron range, it is necessary to reduce the wavelengths of the light utilized for microlithography.

For example, lithography with weak x-ray radiation at wavelengths smaller than 193 nm, is conceivable, as has become known from U.S. Pat. No. 5,339,346.

In addition to illumination according to U.S. Pat. No. 5,339,346, which requires at least four mirror facets arranged symmetrically in pairs in respect to the source, illumination systems can be provided, which operate, for example, by means of plates with reflective raster elements for the homogeneous illumination of the annular field of an exposure objective. Such systems have the advantage that the field of an objective is illuminated homogeneously with as few reflections as possible, and also that an illumination of the pupil up to a specific filling ratio independent of the field is assured.

Reflective raster element plates for EUV-illumination systems have become known from U.S. Pat. No. 5,581,605.

The disclosures content of both of the above-named documents, U.S. Pat. No. 5,339,346 as well as U.S. Pat. No. 5,581,605 are incorporated in their entirety in the present application.

The following light sources are discussed at present as light sources for EUV-illumination systems:

laser plasma sources pinch plasma sources synchrotron radiation sources

In the case of laser plasma sources, an intensive laser beam is focussed onto a target (solid, gas jet, droplet). The target is heated so strongly by the excitation that a plasma is formed. This emits EUV-radiation.

Typical laser plasma sources have an angular characteristic like a sphere, that is the source radiates in each direction with nearly the same intensity, i.e., a radiation angle range of $4\pi$ as well as a diameter of 50 $\mu$m to 200 $\mu$m.

For pinch plasma sources, the plasma is produced by means of electrical excitation.

Pinch plasma sources can be described as volume radiators ($\phi$=1.00 mm), which radiate in $4\pi$, whereby the beam characteristic is given by the mechanical source geometry.

In the case of synchrotron radiation sources, one can currently distinguish among three types of sources:

bending magnets wigglers undulators

In the case of bending magnet sources, the electrons are deflected by a bending magnet and photon radiation is emitted.

Wiggler sources comprise a so-called wiggler for deflecting an electron beam, and this wiggler comprises a multiple number of alternating polarized pairs of magnets arranged in rows. If an electron passes through a wiggler, then the electron is subjected to a periodic, vertical magnetic field; the electron correspondingly oscillates in the horizontal plane. Wigglers are also characterized by the fact that no coherency effects occur. The synchrotron radiation produced by means of a wiggler is similar to that of a bending magnet and radiates in a horizontal solid angle. In contrast to the bending magnet, it has a flux which is intensified by the number of poles of the wiggler.

There is no clear dividing line between wiggler sources and undulator sources.

In the case of undulator sources, the electrons in the undulator are subjected to a magnetic field with shorter periods and smaller magnetic field of the deflection poles than in the case of the wiggler, so that interference effects occur in the synchrotron radiation. The synchrotron radiation has a discontinuous spectrum based on the interference effects and emits both horizontally as well as vertically in a small solid-angle element; i.e., the radiation is highly directional.

Since the extension and angular spectrum of the currently discussed EUV-light sources are insufficient for filling or for illuminating field and aperture in the reticle plane of a lithography projection exposure system, the illumination systems presently discussed comprise at least one mirror or one lens with raster elements for producing a multiple number of secondary light sources, which are distributed uniformly in the diaphragm plane. Since the geometric form of the raster elements of the first mirror or of the first lens corresponds to the form of the illuminated field in the reticle plane, raster elements of the first mirror or of the first lens are preferably formed as rectangles, if the field to be illuminated is rectangular or represents a segment of an annular field. The optical effect of the raster elements of the first mirror or of the first lens, which are also designated below as field raster elements or field facets, is designed in such a way that images of the light source are formed in the diaphragm plane. Such light sources are so-called secondary light sources.

An EUV-illumination system, in which a number of secondary light sources are formed in a plane by means of two one-dimensional arrays, which are arranged perpendicular to each other, has been made known, for example, from U.S. Pat. No. 5,677,939. It is a disadvantage with this arrangement that two arrays of cylinder mirrors are necessary in order to illuminate a field with large aspect ratio and the exit pupil of the illumination system simultaneously.

In a second example, a system is shown in U.S. Pat. No. 5,677,939, in which critical Köhler illumination is produced by means of a one-dimensional array of cylinder mirrors. It is disadvantageous in this case that the exit pupil of the illumination system is illuminated by single lines and thus is illuminated nonuniformly.

If the extent of the light source is small, for example, approximately like a point source, as in the case of an undulator source, then the extent of the secondary light sources formed by the field raster elements is also small. All light rays coming from the field raster elements are focused to the point-like secondary light sources. In this case an image of the field raster element is formed in each plane after the corresponding secondary light source wherein the imaging scale is given by the ratio of the secondary light source/reticle distance to the field raster element/secondary light source distance. The field raster elements are tilted such that the images of the field raster elements overlap in the reticle plane, at least in part.

The edge sharpness, i.e., the distance between the 0% point and the 100% point of the intensity distribution of the image of the field raster elements, is almost zero in the case of point-like light sources, i.e., the intensity decreases from 100% directly to 0% for ideal imaging.

In the case of extended light sources, the secondary light sources are also extended, so that the image of the field raster elements in the reticle plane is not sharp. The edge sharpness of the image of the field raster elements increases.

If one wishes to prevent an over-illumination of the pregiven width of the field to be illuminated, then this can be achieved by reducing the height of the field raster elements. Field raster elements designed in such a way have a high aspect ratio.

Field raster elements with high aspect ratio are also caused by the fact that the field to be illuminated has a large aspect ratio, for example, an x-y aspect ratio of 17.5:1. An aspect ratio is also known as a lateral magnification.

Field raster elements with a high aspect ratio, however, can be distributed only unfavorably on a field raster element plate and are expensive to manufacture.

SUMMARY OF THE INVENTION

The object of the invention is thus to create an illumination system, particularly for EUV-lithography, which has a simple structure and in which the disadvantages of the prior art can be avoided, and wherein the field to be illuminated has an aspect ratio #1:1.

According to the invention, the object is solved in that a portion of the optical components of the illumination system produce an anamorphotic effect. This leads to the fact that the secondary light sources are split into tangential and sagittal secondary line sources, wherein the lines sources are oriented perpendicularly.

The tangential secondary light sources are formed by means of a ray bundle in the y-z plane, and the sagittal secondary light sources are formed by a ray bundle running in the x-z plane. The direction of the larger dimension of the field to be illuminated is taken as the x-direction, and the direction of the smaller dimension of the field to be illuminated is taken as the y-direction in the following description, and the direction standing perpendicular to both the x-direction as well as the y-direction is denoted the z-direction. The y-direction is also the scanning direction in the case of a scanning lithography system, and the x-direction is the direction perpendicular to the scanning direction.

The optical components for the transformation of the light source into secondary light sources comprise at least one mirror or one lens, which is or which are organized into raster elements, wherein the raster elements have a two-dimensional arrangement. By this feature, a very regular illumination of the exit pupil can be achieved.

For the illumination of the mirror or the plate with raster elements, a collector unit is used, which is adapted to the respective source.

The two-dimensionally arranged raster elements on the first mirror or lens are preferably arranged in individual rows adjacent to one another, whereby each row comprises several raster elements lying next to one another. The individual rows are in turn displaced towards one another, which leads to a more uniform illumination of the exit pupil.

One embodiment of the invention provides that the raster elements of the mirror or of the lens are formed for producing sagittal and tangential secondary light sources in such a way that each raster element produces an anamorphotic effect, for example, by forming the raster elements of the first mirror as cylinders or toroids.

In a particular configuration of the invention, it is provided that the collector unit has an anamorphotic effect, and thus the light source is imaged in a secondary light source, which is split into tangential and a sagittal light sources.

The field that is to be illuminated comprises a rectangular shape or an annular segment, so that the raster elements are advantageously configured as rectangles. Since the raster elements are imaged in the field plane, they are also designated as field raster elements.

In the case of an embodiment with very large aspect ratios of the field to be illuminated, for example, an x-y aspect ratio of 17.5:1, 13:1 or 2:1, it is advantageously provided that the aspect ratio of the cylindrical or toroidal field raster elements is smaller. In the case of an x-y aspect ratio of the field to be illuminated of 17.5:1 or 13:1, the aspect ratio of the field raster elements can be, for example, 4:1; in the case of an x-y aspect ratio of the field to be illuminated of 2:1, for example, that of the field raster elements can be 1.5:1.

Depending on the field mirror(s) or field lens(es) used in the illumination system, it is advantageous to arrange the field raster elements on the first mirror or lens in such a way that the images of the secondary light sources, which are produced by the field mirrors or field lens(es) and which are designated herein below as "tertiary light sources", are distributed in an extensively uniform manner in the exit pupil of the illumination system. The tertiary light sources are sometimes also called "partial pupils".

For this purpose, the rastering of the tertiary light sources in the exit pupil of the illumination system, i.e., the positions of the tertiary light sources in the exit pupil, is first provided in advance. Then, the position of the field raster elements on the field raster element plate is determined by tracing the principal rays of the tertiary light sources backwards through the field lens or field lenses up to the plane, which is defined by the field raster element plate. The direction of the principal rays is given in advance, so that they intersect the center of the reticle plane. Their intersection points on the field raster element plate determine the positions of the field raster elements. For this type of determination of the positions of the field raster elements, the boundary condition must be maintained that the distance between the tertiary light sources in the pregiven rastering is selected such that the field raster elements do not overlap.

Based on optical imaging errors of the field lens imaging, e.g., distortion, the field raster elements may be asymmetrically arranged on the field raster element plate.

In order to compensate for the intensity tilt in the pupil illumination caused by the asymmetric arrangement of the raster elements, it is advantageously provided to adapt the reflectivities of the raster elements in an appropriate manner.

It is also possible to correspondingly adapt the collector unit.

In order to obtain a sharp image of the field raster elements in the reticle plane in systems with extended light sources, one can advantageously provide a second mirror or a lens with raster elements, wherein the raster elements of the second mirror or of the second lens are arranged at the position of the secondary light sources. The raster elements of the second mirror or of the second lens are called pupil raster elements.

In the case of systems with two mirrors with raster elements, the form of the raster elements of the second mirror, i.e., the pupil raster elements, is adapted in an advantageous manner to the form of the secondary light sources and thus differs from the form of the first raster elements, i.e., the field raster elements. For example, the pupil raster elements can be of round shape in case the light source is round in shape. Whether or not pupil raster elements are necessary depends on the design of the field raster elements and the extent and the angle distribution of the light source. The product of the spatial and angular extent of the light source at the source point of view view, or the product of the field extent and aperture at the field point of view, is designated as the Etendu or Lagrange optical invariant (light conductance (LC)). The Etendu can be defined one-dimensionally or two-dimensionally. The tangential Etendu considers only rays that run in the y-z plane. In this case the Etendu is given by the product of the y-field height and the aperture in the y-z-plane. The two-dimensional Etendu considers all rays. In this case the Etendu is given by the product of the field area and the square of the aperture.

Depending on the type of light source, the following cases can be distinguished:

1. Tangential Etendu of the source<<tangential Etendu of the field to be illuminated, i.e., edge sharpness<<y-field dimension. An illumination system without pupil raster elements is possible.

2. Tangential Etendu of the source=tangential Etendu of the field to be illuminated, i.e., edge sharpness=y-field dimension. A design without pupil raster elements is possible, if components with anamorphotic effect are used. The illumination should be made critical in the y-direction and it should be made a Köhler illumination in the x-direction. In order to image the x-direction with sharp edges, cylindrical or toroidal raster elements can be used as pupil raster elements at the location of the sagittal light sources in a further embodiment of the invention.

3. Two-dimensional Etendu of the source≦two-dimensional Etendu of the field to be illuminated and tangential Etendu of the source>tangential Etendu of the field. In this case, it is necessary to provide pupil raster elements for the correct illumination of the field.

For application of the illumination system in a scanning lithography system, it is not absolutely necessary to image the narrow side of a field raster element, i.e., the y-direction, so that the edges are sharp. It is only important that the illuminated field lies within the object field defined by the subsequent projection objective. Typical projection objectives for EUV-Lithography have ring-shaped or annular object fields.

As long as this can be achieved with expanded light sources by the reduction of the width of the field raster elements or with the use of field raster elements with anamorphotic effect (up to the critical illumination of the narrow field side), it is not necessary to provide pupil raster elements for the imaging of the y-direction of the field raster elements.

However, if in critical illumination the illumination of the field exceeds the maximum possible field width in the y-direction, then pupil raster elements are necessary for the y-direction.

Perpendicular to the scanning direction, i.e., in the x-direction, the illuminated field should have sharp edges, since otherwise, the illuminated field perpendicular to the scanning direction, i.e., in the x-direction, would have to be limited by means of additional masking devices, which would lead to a loss of light due to the vignetting of the illuminated field. In the case of extended light sources, pupil raster elements can thus be advantageously provided for the x-direction.

What type of pupil raster elements are used depends on which requirements are established for field illumination.

If the edge sharpness of the images of the field raster elements need to be sharp only in the x-direction of the illuminated field, in the reticle plane, cylindrical pupil raster elements can be applied at the location of the sagittal secondary light sources. The cylinders are thus oriented in the direction of the sagittal secondary line light sources and image the long side of the field raster elements in the reticle plane.

If the imaging must also be influenced in the y-direction, then toroidal pupil raster elements are used. They image the long side of the field raster elements in the reticle plane and limit the illumination in the y-direction to the permissible range. They are arranged either at the location of the sagittal secondary light sources or between sagittal and tangential light sources. In the case of an arrangement between sagittal and tangential light sources, imaging of the field raster elements and the raster element dimensions must be appropriately adapted.

Field and pupil raster elements are arranged and aligned such that a light path is produced between each field and each pupil raster element; the superimposition of the images of the field raster elements is achieved in the reticle plane and the tertiary light sources are distributed as uniformly as possible in the exit pupil of the illumination system. With respect to the method for arranging the field and pupil raster elements, reference is made to U.S. Pat. No. 6,198,793, filed on May 4, 1999 with the title "Illumination system, particularly for EUV-lithography", of the Applicant, whose disclosure content is incorporated to the fall extent in the present application.

Advantageously, the field mirrors or the field lens(es) of the illumination system according to the invention are formed in such a way that the diaphragm plane is imaged in the exit pupil of the illumination system.

By splitting the secondary light sources into tangential and sagittal secondary light sources according to the invention, the following advantages can be obtained; of course they may also be combined:

1. Reduction of the raster element aspect ratio by optical components with anamorphotic effect.

In the case of a point-like light source, the field raster elements can be imaged in the image plane with a high edge sharpness, even with a raster element aspect ratio that is reduced in comparison to the field aspect ratio, whereby the anamorphotic effect must be designed correspondingly.

2. Illumination of the field in the case of expanded light sources.

In the case of expanded light sources, the edge sharpness, which is produced without pupil raster elements, can be taken into account in such a way that the tangential light source is shifted in the direction of the image plane. This is possible by means of a reduction of the y-refractive power of the field raster element with anamorphotic effect. In this manner, the y-width of the image of the field raster element is reduced. The critical illumination in the y-direction at which the tangential light source is situated in the reticle plane represents the limit of this shift. The source is then imaged in the y-direction in the image plane. The y-dimension of the image of the light source should in this case not exceed the y-width of the illuminated field.

Otherwise, the illuminated field would have to be masked or pupil raster elements would have to be used.

BRIEF DESCRIPTION OF THE DRAWINGS

The invention will be described in the following on the basis of the figures as examples.

Here.

DESCRIPTION OF THE INVENTION

Figure 1:
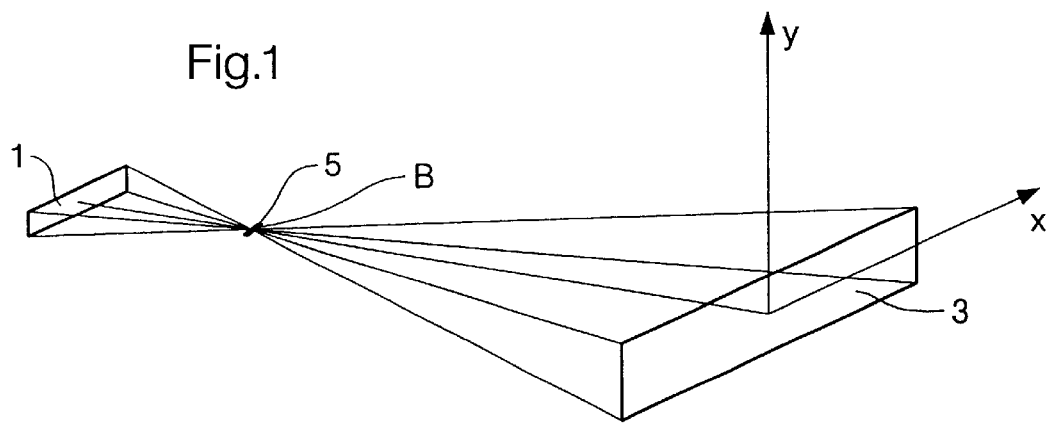
FIG. 1 shows the path of the light beams of a field raster element, which corresponds in geometry to the surface to be illuminated and is formed as a plane.

In FIG. 1, the light path from a field raster element 1, whose form corresponds to the field extension in the image plane 3 where the reticle is located, is shown The field raster element focuses the light bundle in the diaphragm plane B and produces a secondary light source 5. The angle distribution of the rays at the location of the secondary light source 5 corresponds to the field shape or dimension. Field raster elements 1 may have a planar optical surface, if the light beams impinge on field raster elements 1 with the required convergence. Otherwise, they have a positive power, in order to produce secondary light source 5.

The magnification between field raster element and field is given by the ratio of the distances: secondary light source 5—reticle 3 and field raster element 1—secondary light source 5.

Figure 2:
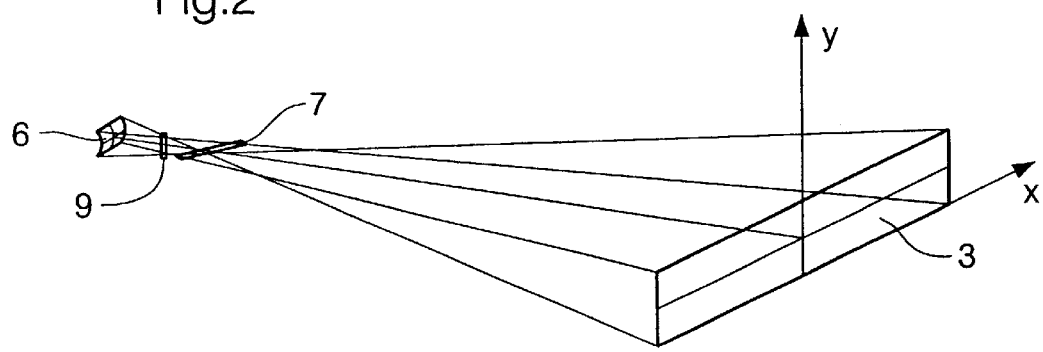
FIG. 2 shows the light beams of a cylindrical raster element with anamorphotic effect.

FIG. 2 shows the light path starting from a field raster element 6 with anamorphotic effect to reticle 3.

A different magnification for the tangential imaging (y-direction) and for the sagittal imaging (x-direction) can be established with field raster elements 6 with anamorphotic effect. In this manner, the secondary light source is split into a tangential line source 7 and a sagittal line source 9.

The aspect ratio of the field raster element can be clearly reduced in this way if compared with the aspect ratio of the field to be illuminated. The field raster elements can have a cylindrical optical surface, if the sagittal or tangential light beams impinge the field raster elements 6 with the required convergence.

Figure 3:
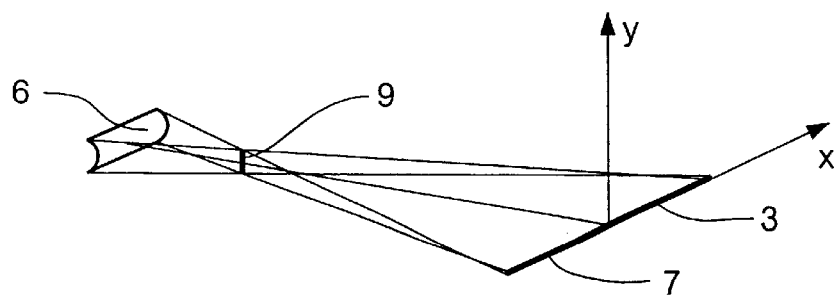
FIG. 3 shows the light sources of a cylindrical raster element with anamorphotic effect, whereby the critical illumination in the y-direction, at which the tangential light source is situated in the reticle plane. This case represents the borderline case.

The borderline case of critical illumination is shown in FIG. 3, in which the tangential light source 7 is situated in reticle plane 3.

An illumination system according to the invention can have the following individual components:
- a collector unit, e.g., for a laser plasma source, an ellipsoidal mirror, which collects the light generated, for example, from a laser plasma source and images the source into a secondary light source;
- a field raster element plate, comprising a plurality of individual mirrors, for example, which decompose the collimated light bundle into partial bundles and superimpose the partial bundles in the reticle plane. The field raster elements are designed as cylindrical raster elements, which are planar in the x-section and have a divergent effect in the y-section in one embodiment of the invention. In this embodiment of the invention, the sagittal secondary line sources lie at the location of the secondary light source of the collector mirror, since the field raster elements are planar in the x-section and thus do not have an optical effect. Due to the divergent effect in the y-direction, the tangential secondary line sources are situated between the sagittal secondary light sources and the image plane, where the reticle is located. The raster elements are tilted such that their images are superimposed in the reticle plane. In this respect, reference is made to U.S. Pat. No. 6,198,793, as mentioned earlier, and whose disclosure content is incorporated to the full extent in the present application.

In addition to the previously described components, an illumination system according to the invention has a field lens group, comprising one or more field mirrors. The field lens group in this case is formed of two grazing-incidence toroidal mirrors which form the annular field, adjust the uniformity of the scanning energy distribution, and arrange the exit pupil of the illumination system in the entrance pupil of a following projection objective. The values of the scanning energy distribution are defined as the line integral in the scanning direction at points being arranged on a line perpendicular to the scanning direction.

Figure 4:
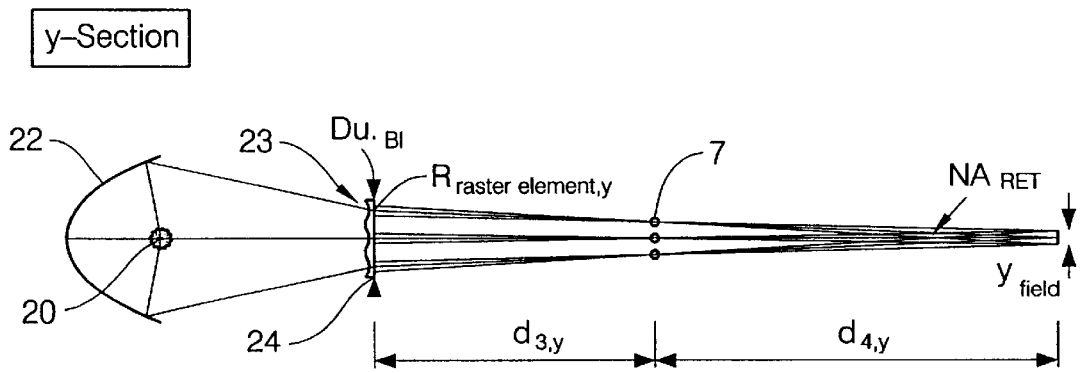
FIG. 4 shows the y-section through a system with light source, collector mirror and cylindrical raster element plate.
Figure 5:
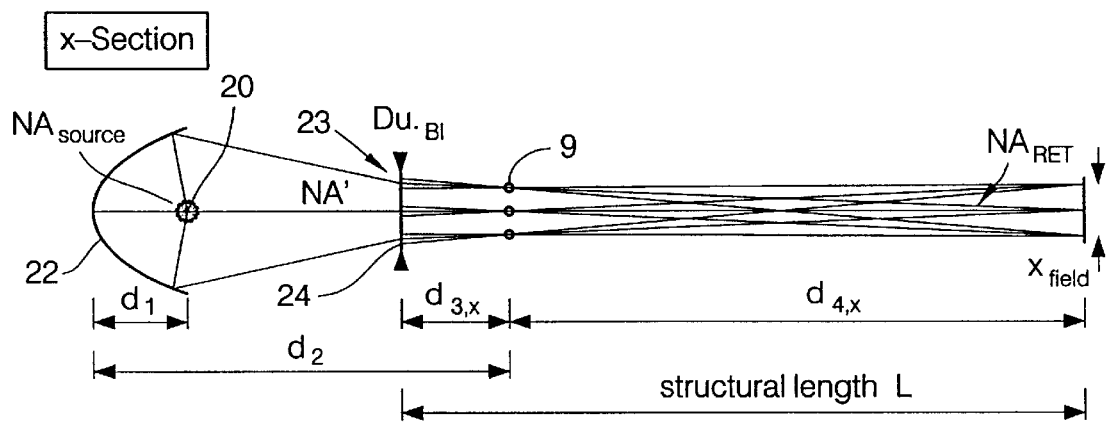
FIG. 5 shows the x-section through the system according to FIG. 4 with light source, collector mirror, and cylindrical raster element plate.
Figure 6:
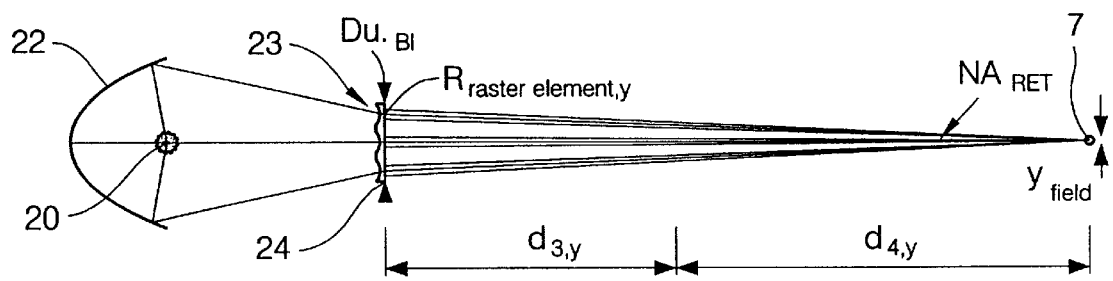
FIG. 6 shows the y-section through a system with light source, collector mirror, and cylindrical raster element plate, wherein the critical illumination in the direction, at which the tangential light source is situated in the reticle plane, is shown. This case represents the borderline case.
Figure 7:
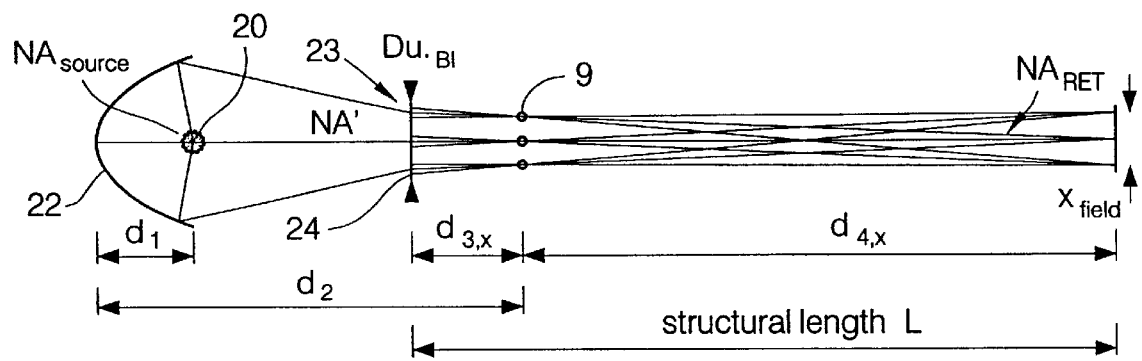
FIG. 7 shows the x-section through a system according to FIG. 6.

The abbreviations used for deriving the system herein are indicated in FIGS. 4 to 7. For better representation, the system is arranged linearly. FIGS. 4 and 5 show a system with field raster elements with anamorphotic effect with Köhler illumination in the x- and y-directions. FIGS. 6 and 7 show a system with anamorphotic field raster elements and Köhler illumination in the x-direction as well as critical illumination in the y-direction.

The same reference numbers as in FIGS. 4–7 are also used in the following figures. Here: 20 is the light source, 22 is the collector mirror, 23 is the raster element plate, and 24 represents the field raster elements of raster element plate 23.

The following abbreviations are used throughout this document:
Wabe=raster element;
anz=number;
Feld=field;
Qu or Quelle=source; and
ex=eccentricity The derivation was made with the following values:
Radius of the annular field R=200 mm, segment angle= 30° for the first, second and fourth forms of embodiment, or R=100 mm; segment angle=60° for the third form of embodiment; field height ±3.0 mm. This corresponds to a rectangular field of 105 mm×6 mm;

aperture at the reticle: $NA_{ret}$=0.025;

aperture at the source: $NA_{source}$=0.999;

$d_1$=100.0 mm;

structural length L=$d_3$+$d_4$=1400 mm;

number of raster elements, which are positioned in an x-row: $anz_{x1}$, whereby the number is a measure for the number of secondary light sources or respectively the homogeneity of the pupil filling.

$anz_x$=6 in the first, second and fourth forms of embodiment;

$anz_z$=4 in the third form of embodiment;

In the first form of embodiment:

Aspect ratio of the raster elements (x/y)=1. In the second and fourth forms of embodiment: aspect ratio of the raster elements (x/y)=4.0. In the third form of embodiment: aspect ratio of raster elements (x/y)=17.5.

$DU_{BL}$: diameter of the field raster element plate $x_{Wabe}$: length of a field raster element in the x-direction $y_{Wabe}$: Width of a field raster element in the y-direction $x_{Feld}$: length of the field to be illuminated in the x-direction $y_{Feld}$: width of the field to be illuminated in the y-direction $\beta^x_{Wabe}$: magnification in the x-direction $\beta^y_{Wabe}$: magnification in the y-direction $R^x_{Wabe}$: radius of curvature of the field raster element in the x-direction $R^y_{Wabe}$: radius of curvature of the field raster element in the y-direction NA': aperture after the collector mirror R: radius of the collector mirror Ex: eccentricity of the collector mirror.

The parameters indicated in FIGS. 4 to 7 are coupled by the following equations:

For the sagittal imaging, the following is valid if $R^x_{Wabe}$=0 mm:

$$NA_{Ret} = \frac{\frac{DU_{BL}}{2}}{L} \Rightarrow DU_{BL} = 2 \cdot L \cdot NA_{Ret}$$

$$\frac{DU_{BL}}{x_{Wabe}} = anz_x \Rightarrow x_{Wabe} = \frac{DU_{BL}}{anz_x}$$

$$\beta^x_{Wabe} = \frac{x_{Feld}}{x_{Wabe}} = \frac{d^x_4}{d^x_3} \Rightarrow \beta^x_{Wabe} = \frac{x_{Feld}}{x_{Wabe}}$$

$$\Rightarrow d^x_4 = d^x_3 \cdot \beta^x_{Wabe}$$

$$L = d^x_3 + d^x_4 \Rightarrow d^x_3 = \frac{L}{1 + \beta^x_{Wabe}}$$

$$NA' = \frac{\frac{DU_{BL}}{2}}{d^x_3} \Rightarrow NA' = \frac{\frac{DU_{BL}}{2}}{d^x_3}$$

$$\tan(\theta) = -\frac{(1-Ex)\cdot\sin(\theta')}{2\sqrt{Ex} - (1-Ex)\cdot\cos(\theta')} \Rightarrow Ex = f(NA_{QU}, NA')$$

$$Ex = \left(\frac{sk-sl}{sk+sl}\right)^2 = \left(\frac{d_2-d_1}{d_2+d_1}\right)^2 \Rightarrow d2 = dl \cdot \frac{1+\sqrt{Ex}}{1-\sqrt{Ex}}$$

$$Ex = 1 - \frac{R}{a} \Rightarrow R = \frac{d_1+d_2}{2}\cdot(1-Ex)$$

For the tangential imaging, the following applies:

$$(x/y) = \frac{x_{Wabe}}{y_{Wabe}} \Rightarrow y_{Wabe} = \frac{x_{Wabe}}{(x/y)}$$

$$\beta^y_{Wabe} = \frac{y_{Feld}}{y_{Wabe}} = \frac{d^y_4}{d^y_3} \Rightarrow \beta^y_{Wabe} = \frac{y_{Feld}}{y_{Wabe}}$$

$$\Rightarrow d^y_4 = d^y_3 \cdot \beta^y_{Wabe}$$

$$L = d^y_3 + d^y_4 \Rightarrow d^y_3 = \frac{L}{1 + \beta^y_{Wabe}}$$

$$\frac{2}{R^y_{Wabe}} = \frac{1}{d^y_3} - \frac{1}{d^x_3} \Rightarrow R^y_{Wabe} = \frac{2 \cdot d^y_3 \cdot d^x_3}{d^x_3 - d^y_3}$$

For the case of critical Köhler illumination, the following applies particularly to tangential imaging:

$$\beta^y_{Wabe} = 0 \Rightarrow \beta^y_{Wabe} = 0$$

$$\Rightarrow d^y_4 = d^y_3 \cdot 0 = 0 \text{ mm}$$

$$L = d^y_3 + d^y_4 \Rightarrow d^y_3 = \frac{L}{1 + 0} = L$$

$$\frac{2}{R^y_{Wabe}} = \frac{1}{d^y_3} - \frac{1}{d^x_3} \Rightarrow R^y_{Wabe} = \frac{2 \cdot L \cdot d^x_3}{d^x_3 - L}$$

If one inserts the previously given values as design data in the above formulas, then all system parameters can be determined without field lens or field mirrors. For all of the subsequent calculation examples, the same collector part and x-section of the system will be used in the following.

The calculation for a system with field raster elements with anamorphotic effect and Köhler illumination in the x- and y-directions as well as six field raster elements per row according to FIGS. 4 and 5 are given below.

EXAMPLES OF EMBODIMENT 1 AND 2

Sagittal imaging for quadratic and 4:1 raster elements:

$$DU_{BL} = 2 \cdot L \cdot NA_{Ret} = 2 \cdot 140 \text{ mm} \cdot 0.025 = 70.0 \text{ mm}$$

$$x_{Wabe} = \frac{DU_{BL}}{anz_x} = \frac{70.0 \text{ mm}}{6.0} \approx 11.0 \text{ mm}$$

$$\beta^x_{Wabe} = \frac{x_{Feld}}{x_{Wabe}} = \frac{105.0 \text{ mm}}{11.0 \text{ mm}} = 9.545$$

$$d^x_3 = \frac{L}{1 + \beta^x_{Wabe}} = \frac{1400.0 \text{ mm}}{1 + 9.545} = 132.759 \text{ mm}$$

$$d^x_4 = d^x_3 \cdot \beta^x_{Wabe} = 132.759 \text{ mm} \cdot 9.545 = 1267.241 \text{ mm}$$

$$NA' = \frac{\frac{DU_{BL}}{2}}{d^x_3} = \frac{\frac{70.0 \text{ mm}}{2}}{132.759 \text{ mm}} = 0.255$$

$$Ex = f(NA_{QU}, NA') = 0.579$$

$$d2 = d1 \cdot \frac{1 + \sqrt{Ex}}{1 - \sqrt{Ex}} = 100.0 \text{ mm} \cdot \frac{1 + \sqrt{0.579}}{1 - \sqrt{0.579}} = 737.599 \text{ mm}$$

$$R = \frac{d_1 + d_2}{2} \cdot (1 - Ex) = \frac{100.0 \text{ mm} + 737.599 \text{ mm}}{2} \cdot (1 - 0.579) = 176.122 \text{ mm}$$

Tangential imaging for quadratic raster elements (Example of embodiment 1):

$$y_{Wabe} = \frac{x_{Wabe}}{(x/y)} = \frac{11.0 \text{ mm}}{1.0} = 11.0 \text{ mm}$$

$$\beta^y_{Wabe} = \frac{y_{Feld}}{y_{Wabe}} = \frac{6.0 \text{ mm}}{11.0 \text{ mm}} = 0.545$$

$$d^y_3 = \frac{L}{1 + \beta^y_{Wabe}} = \frac{1400 \text{ mm}}{1 + 0.545} = 905.8 \text{ mm}$$

$$d^y_4 = d^y_3 \cdot \beta^y_{Wabe} = 905.8 \text{ mm} \cdot 0.545 = 494.1 \text{ mm}$$

$$R^y_{Wabe} = \frac{2 \cdot d^y_3 \cdot d^x_3}{d^x_3 - d^y_3} = \frac{2 \cdot 905.8 \text{ mm} \cdot 132.759 \text{ mm}}{132.759 \text{ mm} - 905.8 \text{ mm}} = -311.1 \text{ mm}$$

Tangential imaging for 4:1 raster elements (Example of embodiment 2)

$$y_{Wabe} = \frac{x_{Wabe}}{(x/y)} = \frac{11.0 \text{ mm}}{4.0} 2.75 \text{ mm}$$

$$\beta^y_{Wabe} = \frac{y_{Feld}}{y_{Wabe}} = \frac{6.0 \text{ mm}}{2.75 \text{ mm}} = 2.182$$

$$d^y_3 = \frac{L}{1 + \beta^y_{Wabe}} = \frac{1400 \text{ mm}}{1 + 2.182} = 440.0 \text{ mm}$$

$$d^y_4 = d^y_3 \cdot \beta^y_{Wabe} = 440.0 \text{ mm} \cdot 2.182 = 960.0 \text{ mm}$$

$$R^y_{Wabe} = \frac{2 \cdot d^y_3 \cdot d^x_3}{d^x_3 - d^y_3} = \frac{2 \cdot 440.0 \text{ mm} \cdot 132.759 \text{ mm}}{132.759 \text{ mm} - 440.0 \text{ mm}} = -380.2 \text{ mm}$$

The following calculations in Examples of embodiment 3 and 4 show a system with critical Köhler illumination for 17.5:1 as well as 4:1 raster elements:

EXAMPLE OF EMBODIMENT 3

Field raster elements with aspect ratio 17.5:1 and 4 raster elements per row

Sagittal imaging for 17.5:1 raster elements $$DU_{BL} = 2 \cdot L \cdot NA_{Ret} = 2 \cdot 1400 \text{ mm} \cdot 0.025 = 70.0 \text{ mm}$$

$$x_{Wabe} = \frac{DU_{BL}}{anz_x} = \frac{70.0 \text{ mm}}{4.0} \approx 17.5 \text{ mm}$$

$$\beta^x_{Wabe} = \frac{x_{Feld}}{x_{Wabe}} = \frac{105.0 \text{ mm}}{17.5 \text{ mm}} = 6.0$$

$$d^x_3 = \frac{L}{1 + \beta^x_{Wabe}} = \frac{1400.0 \text{ mm}}{1 + 6.0} = 200.0 \text{ mm}$$

$$d^x_4 = d^x_3 \cdot \beta^x_{Wabe} = 200.0 \text{ mm} \cdot 6.0 = 1200.0 \text{ mm}$$

$$NA' = \frac{\frac{DU_{BL}}{2}}{d^x_3} = \frac{\frac{70.0 \text{ mm}}{2}}{200.0 \text{ mm}} = 0.175$$

$$Ex = f(NA_{QU}, NA') = 0.695$$

$$d2 = d1 \cdot \frac{1 + \sqrt{Ex}}{1 - \sqrt{Ex}} = 100.0 \text{ mm} \cdot \frac{1 + \sqrt{0.695}}{1 - \sqrt{0.695}} = 1101.678 \text{ mm}$$

$$R = \frac{d_1 + d_2}{2} \cdot (1 - Ex) =$$

$$\frac{100.0 \text{ mm} + 1101.678 \text{ mm}}{2} \cdot (1 - 0.695) = 183.357 \text{ mm}$$

Tangential imaging for 17.5:1 raster elements:

$$y_{Wabe} = \frac{x_{Wabe}}{(x/y)} = \frac{17.5 \text{ mm}}{17.5} = 1.0 \text{ mm}$$

$$d^y_3 = L = 1400.0 \text{ mm}$$

-continued $$R^y_{Wabe} = \frac{2 \cdot L \cdot d^x_3}{d^x_3 - L} = \frac{2 \cdot 1400.00 \text{ mm} \cdot 200.0 \text{ mm}}{200.0 \text{ mm} - 1400.0 \text{ mm}} = -466.667 \text{ mm}$$

EXAMPLE OF EMBODIMENT 4

Field raster elements with the aspect ratio 4:1 and 6 raster elements per row

Sagittal imaging for 4:1 raster elements:

$$DU_{BL} = 2 \cdot L \cdot NA_{Ret} = 2 \cdot 1400 \text{ mm} \cdot 0.025 = 70.0 \text{ mm}$$

$$x_{Wabe} = \frac{DU_{BL}}{anz_x} = \frac{70.0 \text{ mm}}{6.0} \approx 11.0 \text{ mm}$$

$$\beta^x_{Wabe} = \frac{x_{Feld}}{x_{Wabe}} = \frac{105.0 \text{ mm}}{11.0 \text{ mm}} = 9.545$$

$$d^x_3 = \frac{L}{1 + \beta^x_{Wabe}} = \frac{1400.0 \text{ mm}}{1 + 9.545} = 132.759 \text{ mm}$$

$$d^x_4 = d^x_3 \cdot \beta^x_{Wabe} = 132.759 \text{ mm} \cdot 9.545 = 1267.241 \text{ mm}$$

$$NA' = \frac{\frac{DU_{BL}}{2}}{d^x_3} = \frac{\frac{70.0 \text{ mm}}{2}}{132.759 \text{ mm}} = 0.255$$

$$Ex = f(NA_{QU}, NA') = 0.579$$

$$d2 = d1 \cdot \frac{1 + \sqrt{Ex}}{1 - \sqrt{Ex}} = 100.0 \text{ mm} \cdot \frac{1 + \sqrt{0.579}}{1 - \sqrt{0.579}} = 737.599 \text{ mm}$$

$$R = \frac{d_1 + d_2}{2} \cdot (1 - Ex) = \frac{100.0 \text{ mm} + 737.599 \text{ mm}}{2} \cdot (1 - 0.579) = 176.122 \text{ mm}$$

Tangential imaging for 4:1 raster elements:

$$y_{Wabe} = \frac{x_{Wabe}}{(x/y)} = \frac{11.0 \text{ mm}}{4.0} = 2.75 \text{ mm}$$

$$d^y_3 = L = 1400.0 \text{ mm}$$

$$R^y_{Wabe} = \frac{2 \cdot L \cdot d^x_3}{d^x_3 - L} = \frac{2 \cdot 1400.0 \text{ mm} \cdot 132.759 \text{ mm}}{132.759 \text{ mm} - 1400.0 \text{ mm}} = -293.334 \text{ mm}$$

In the following Example of embodiment 1 described in detail on the basis of FIGS. 8 to 12, a system with Köhler illumination and quadratic field raster elements (field raster elements with aspect ratio 1:1) is considered.

FIGS. 8 to 12 show the beam path and simulation results for an illumination system comprising source 20, collector mirror 22, raster element plate 23 with quadratic field raster elements 24. The same components as in FIGS. 1 to 4 are designated by the same reference numbers. The light source considered in the following examples of embodiment is a laser plasma light source, but it is not restricted thereto. Other light sources are also conceivable, such as pinch-plasma or synchrotron radiation sources, for example. The collector unit is configured as a collector mirror 22 with positive power particularly for the case of the laser plasma light source. For other sources, a collector unit that is adapted to the source is chosen.

Figure 8:
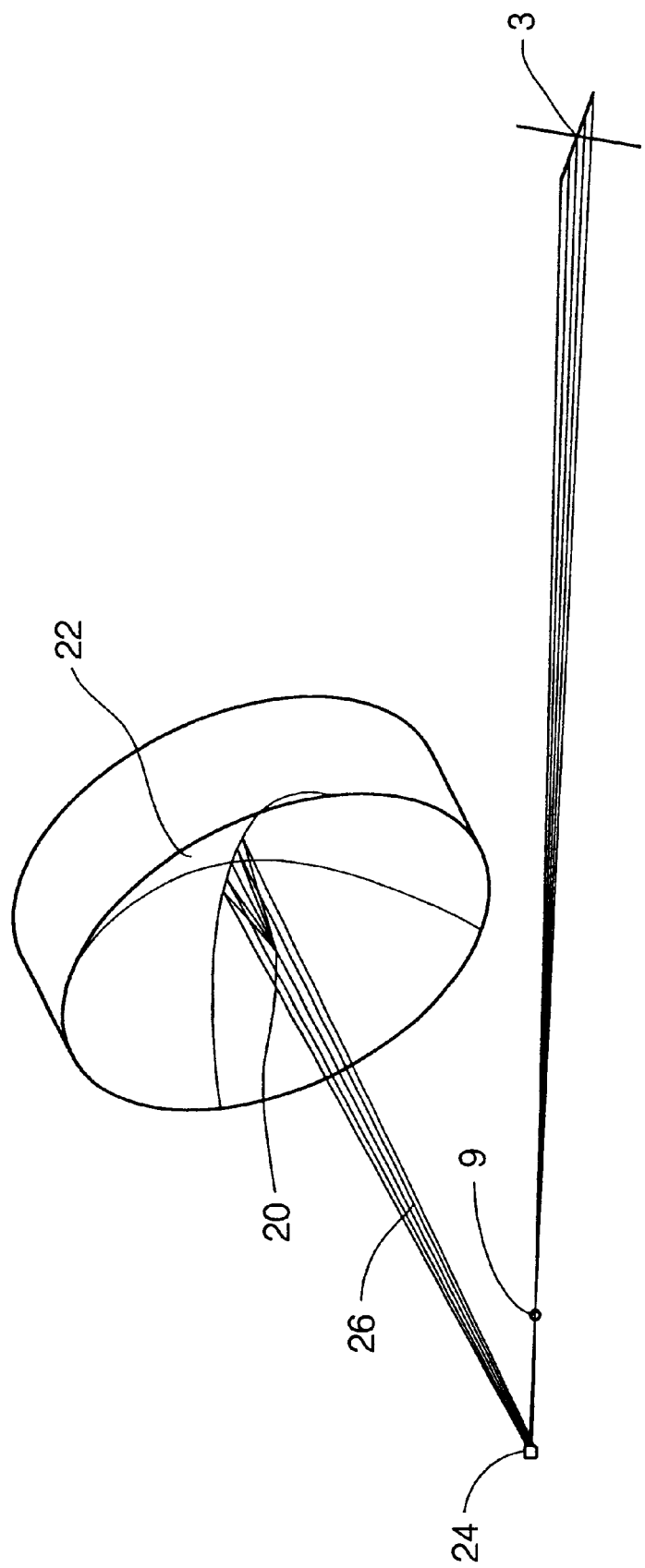
FIG. 8 shows the sagittal ray bundle of a system with light source, collector mirror, and a square cylinder raster element in the center of the field raster element plate.

FIG. 8 shows a sagittal beam bundle 26, which illuminates the cylinder raster element in the center of raster element plate 23. The collecting effect in the sagittal section is introduced only by the collector mirror 22. The x-section of the field raster elements 24 is planar.

Figure 9:
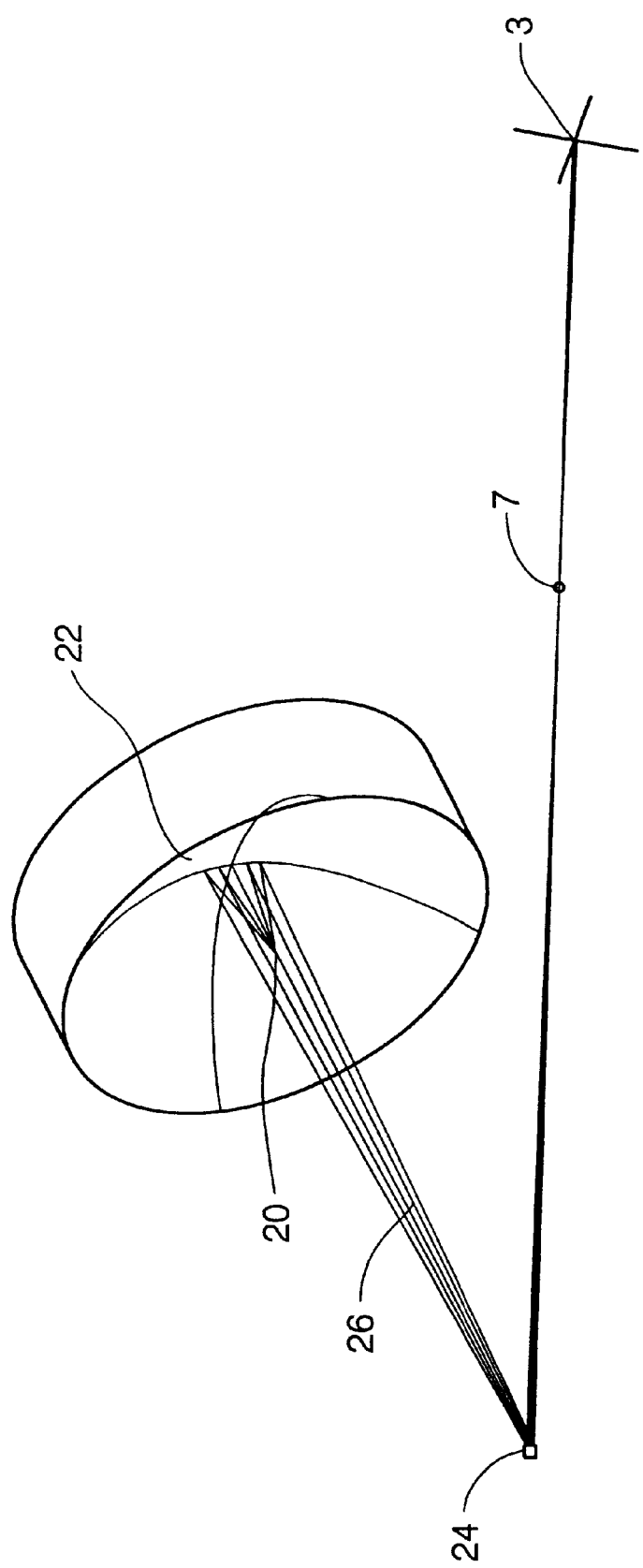
FIG. 9 shows the tangential ray bundle of a system according to FIG. 8.

FIG. 9 shows a tangential beam bundle 28, which illuminates field raster element 24 in the center of the raster element plate. The y-section of the field raster element has a negative power to diverge the rays, so that the tangential secondary light source 7 is shifted to the field or reticle 3. In this manner, the magnification for the y-imaging of the raster element is reduced.

Figure 10:
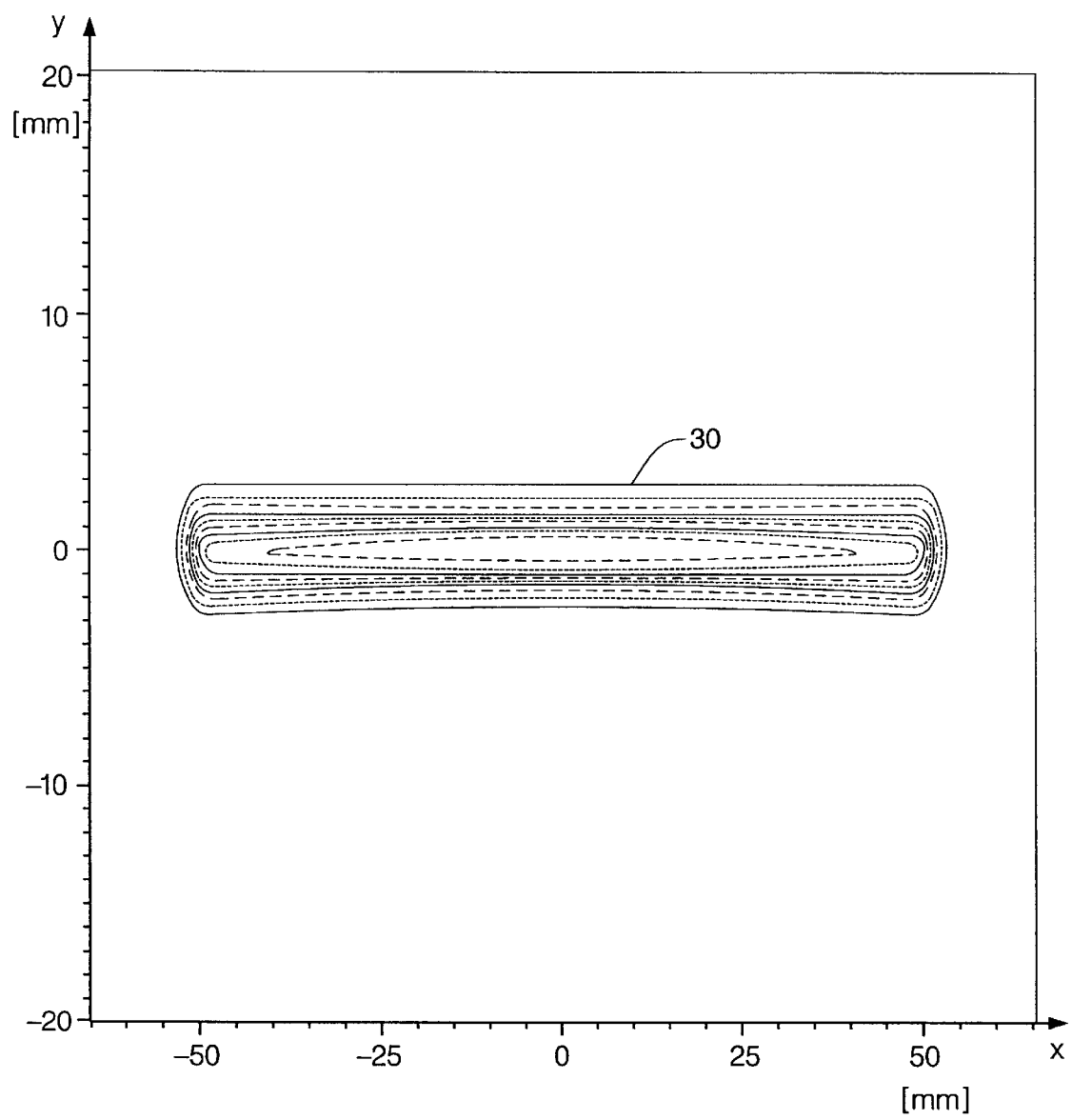
FIGS. 10, 11 show the illumination of the rectangular field in the temporary image plane of an embodiment according to FIG. 8.
Figure 11:
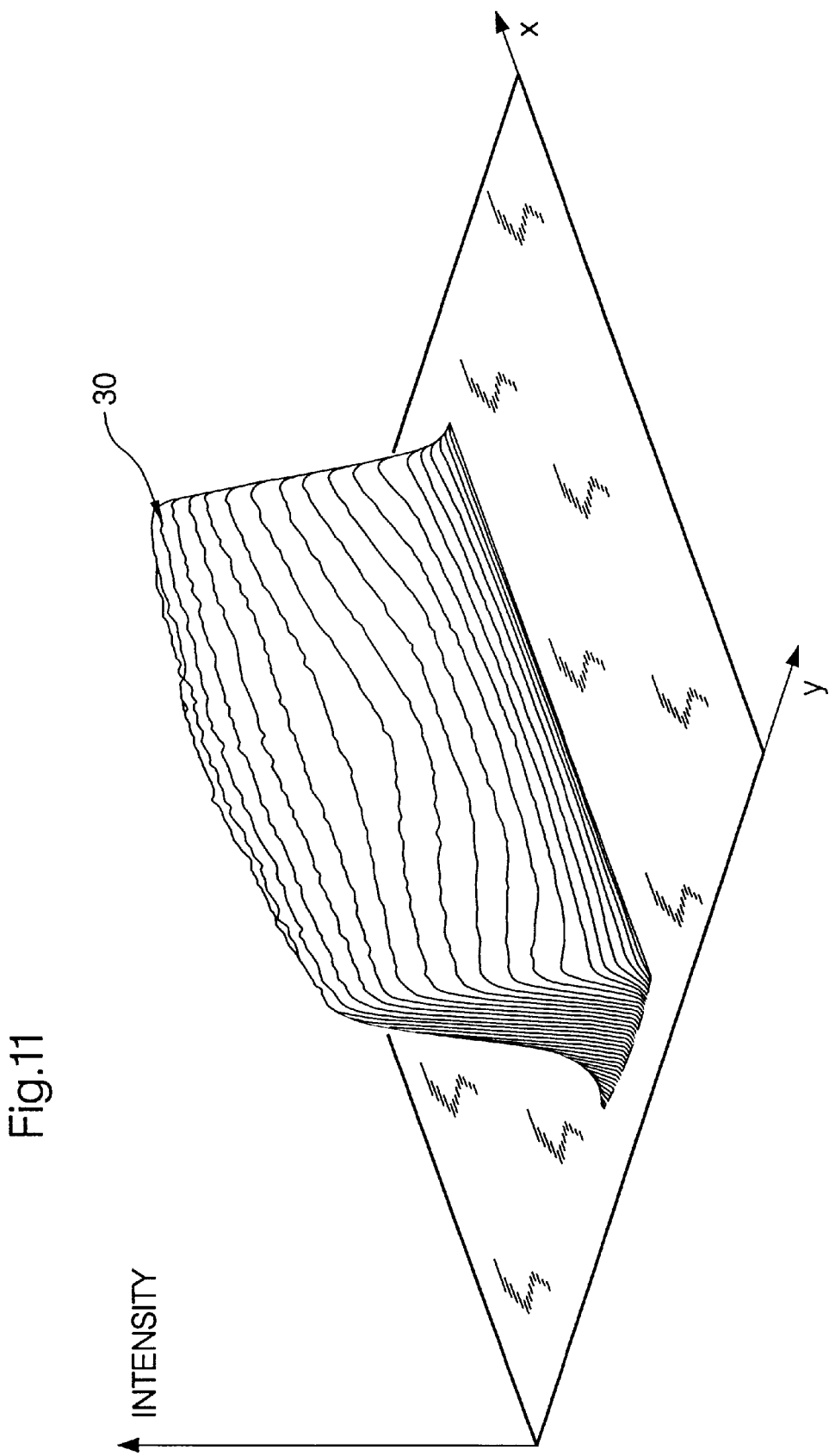
Figure 12:
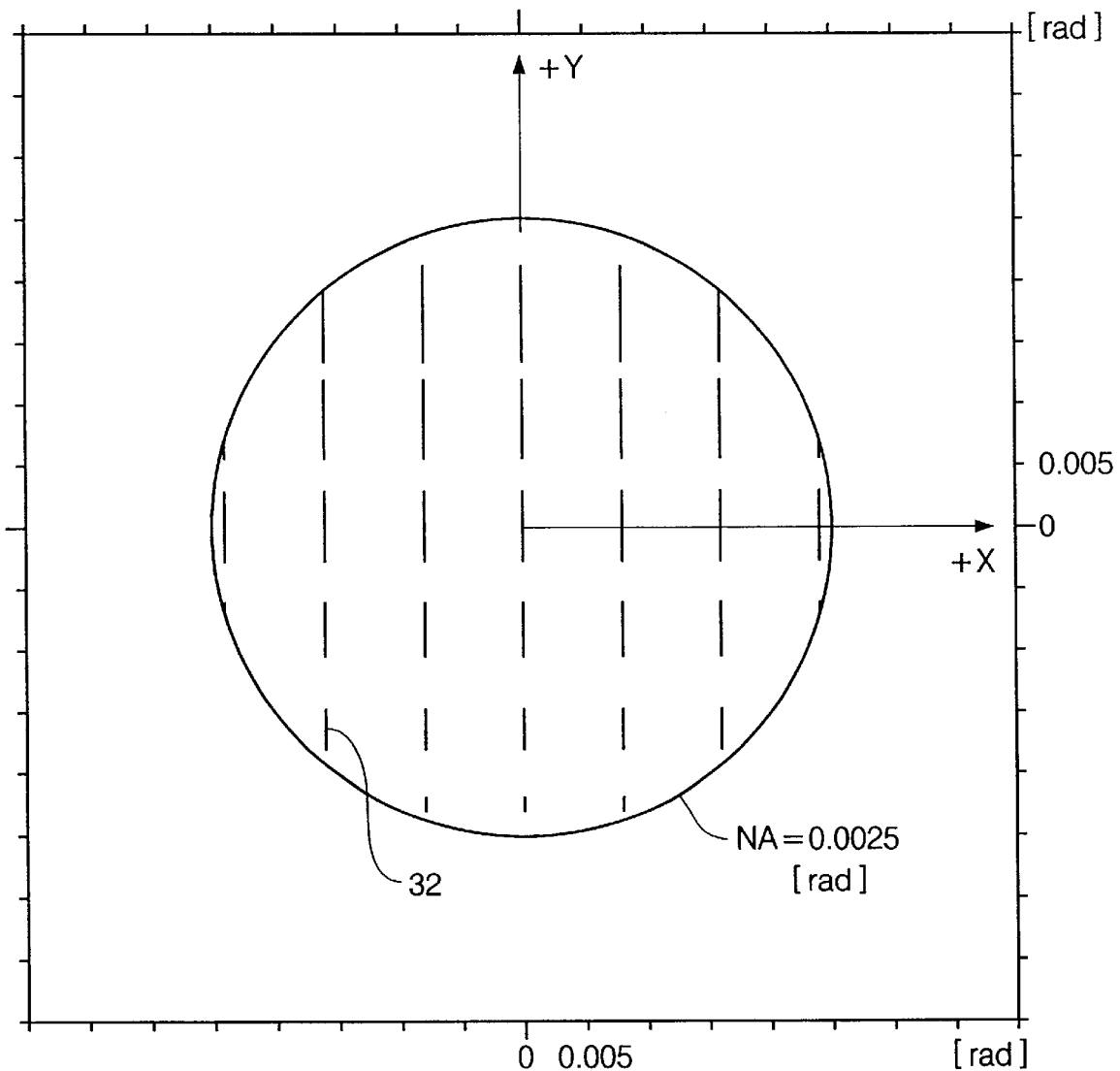
FIG. 12 shows the pupil illumination for a field point in the center of the field of a system according to FIG. 8.

FIGS. 10 to 11 show the illumination of the rectangular field (105.5 mm×6.0 mm) 30 in the temporary image plane using the previously set forth design data. FIG. 10 is an elevation line representation; FIG. 11 is a perspective representation of the intensity distribution. In FIGS. 10 and 11, reference is made to a temporary image plane, since the consideration is made without field mirror or field lens. FIG. 12 shows the pupil illumination for a field point in the center of the field. The pupil illumination for a point indicates from which directions, given as angles, the respective point is illuminated. The beam angles are referred to the principal beam. A quadratic grid of tertiary light sources 32 results corresponding to the arrangement of the field raster elements on a quadratic grid. The tertiary light sources 32 are drawn in length in the y-direction, since the light source is imaged at different magnifications in the sagittal and tangential image planes.

The details of Example of embodiment 2 with 4:1 raster elements and Köhler illumination are described in the following on the basis of FIGS. 13 to 17. The same components as in the previous figures are given the same reference numbers.

FIGS. 13 to 17 show the beam path and illumination resulting for the structure with source 20, condenser 22, raster element plate 23 with 4:1 cylinder raster elements 34 (raster elements with aspect ratio 4:1).

Figure 13:
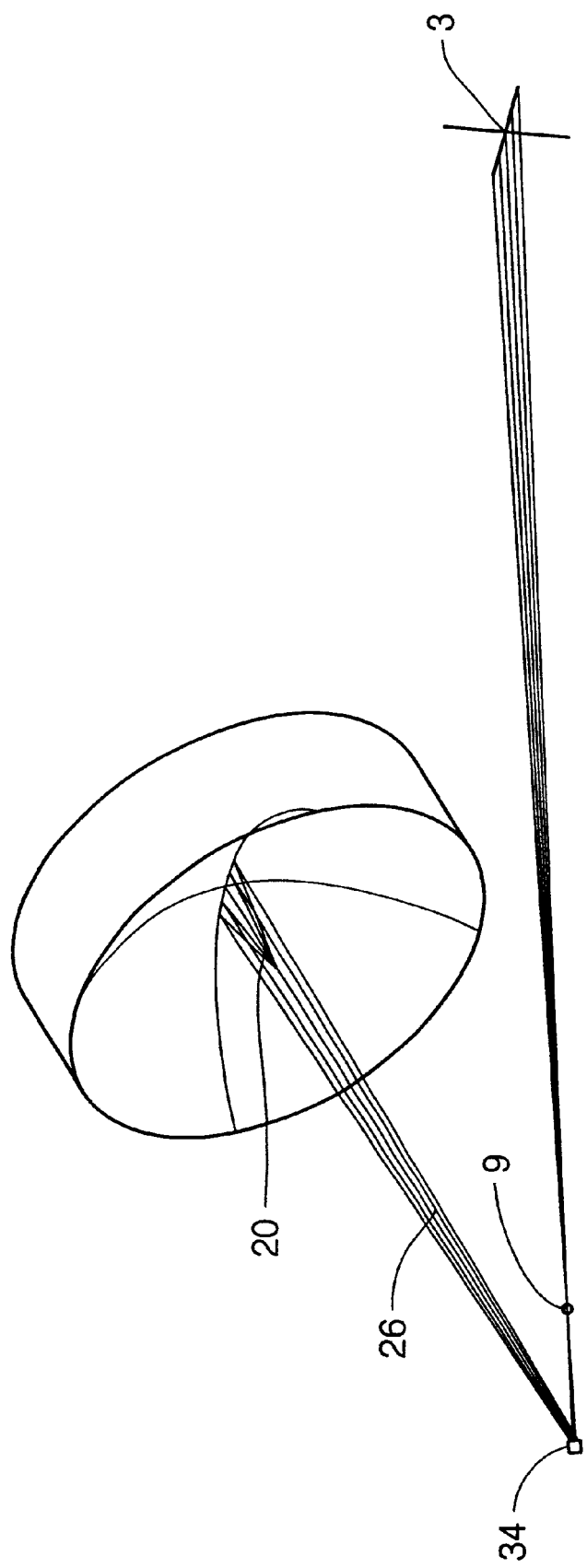
FIG. 13 shows the sagittal ray bundle of a system comprising a light source, collector mirror, and a cylindrical raster element with an aspect ratio of 4:1 in the center of the field raster element plate.

FIG. 13 shows a sagittal beam bundle 26. The same configuration as according to FIG. 8 results in the case of the quadratic field raster elements.

Figure 14:
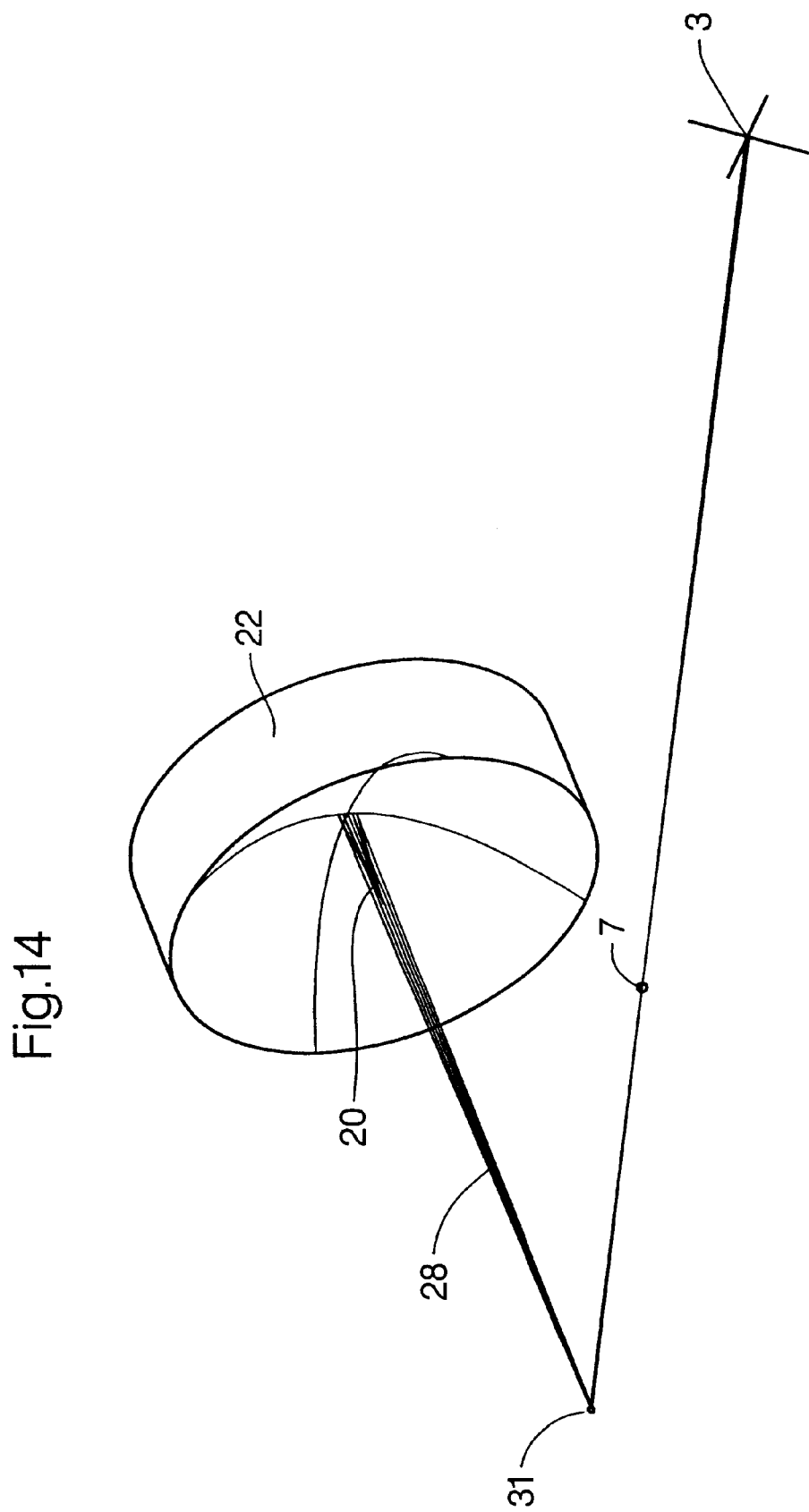
FIG. 14 shows the tangential ray bundle of a system according to FIG. 13.

FIG. 14 shows a tangential beam bundle 28. In comparison to the quadratic raster elements according to Example of embodiment 1, the negative power of the y-section and therefore the divergent effect of the field raster element is smaller.

Figure 15:
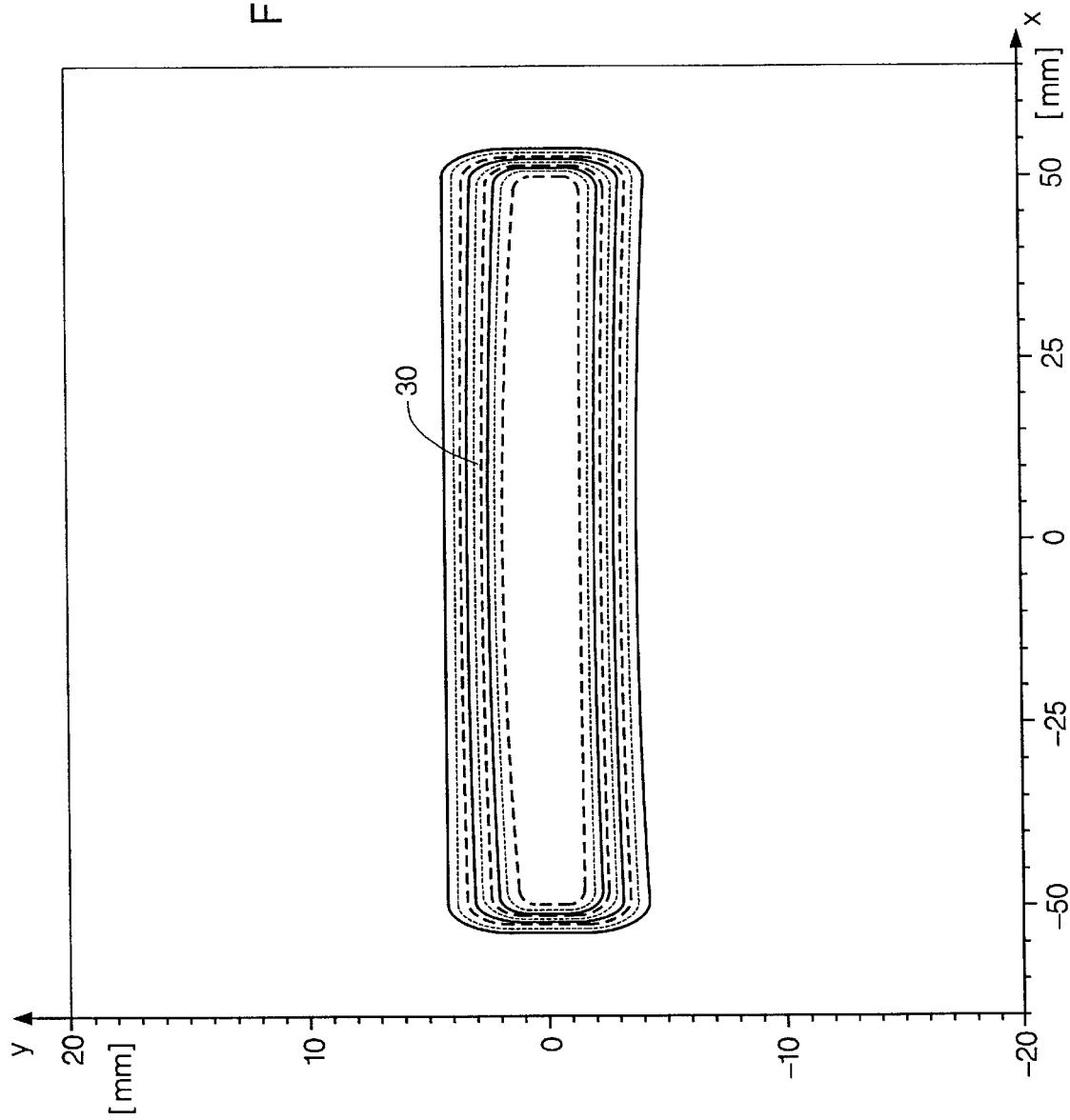
FIGS. 15, 16 show the illumination of the rectangular field of a system according to FIG. 13.
Figure 16:
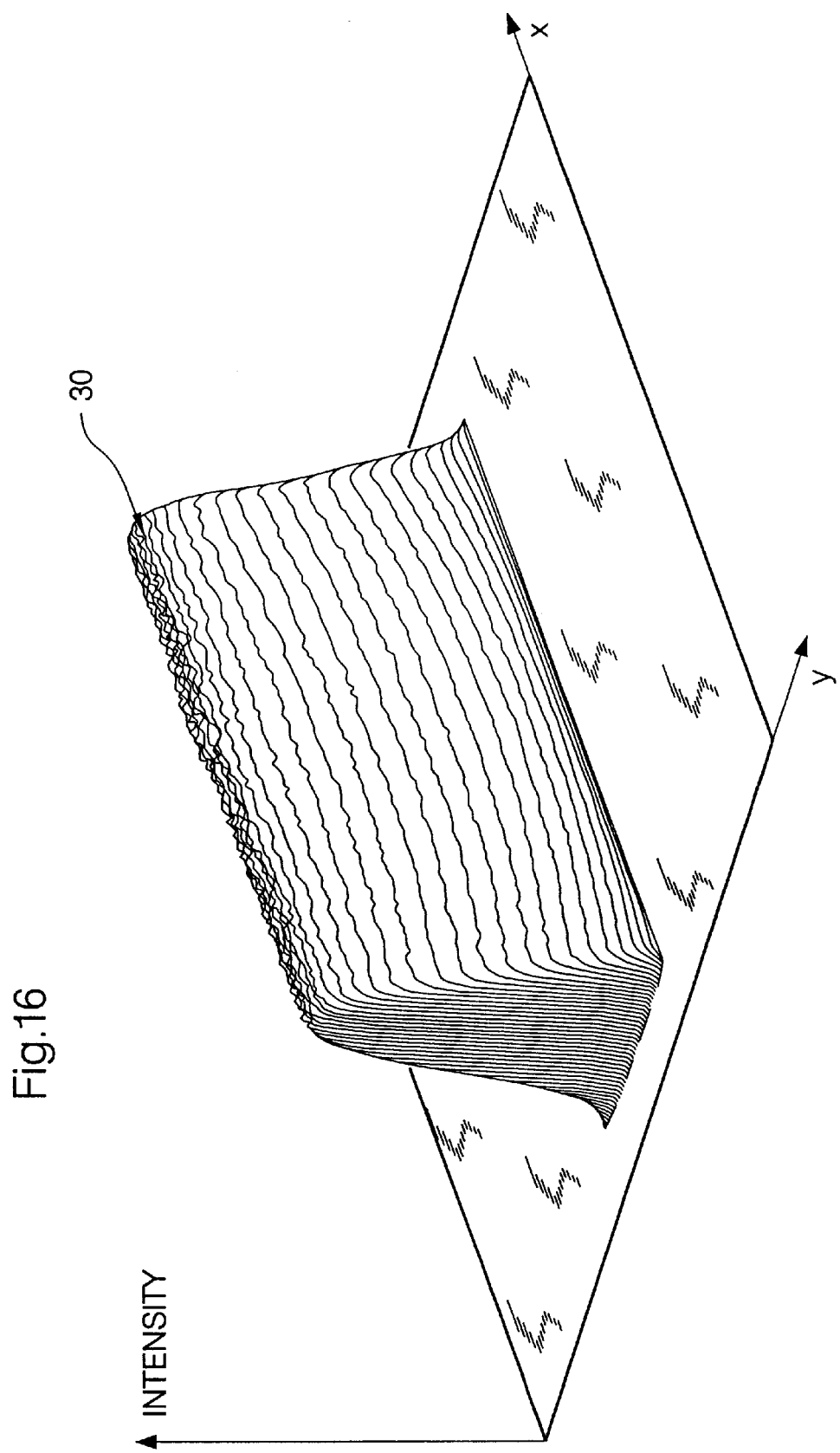
Figure 17:
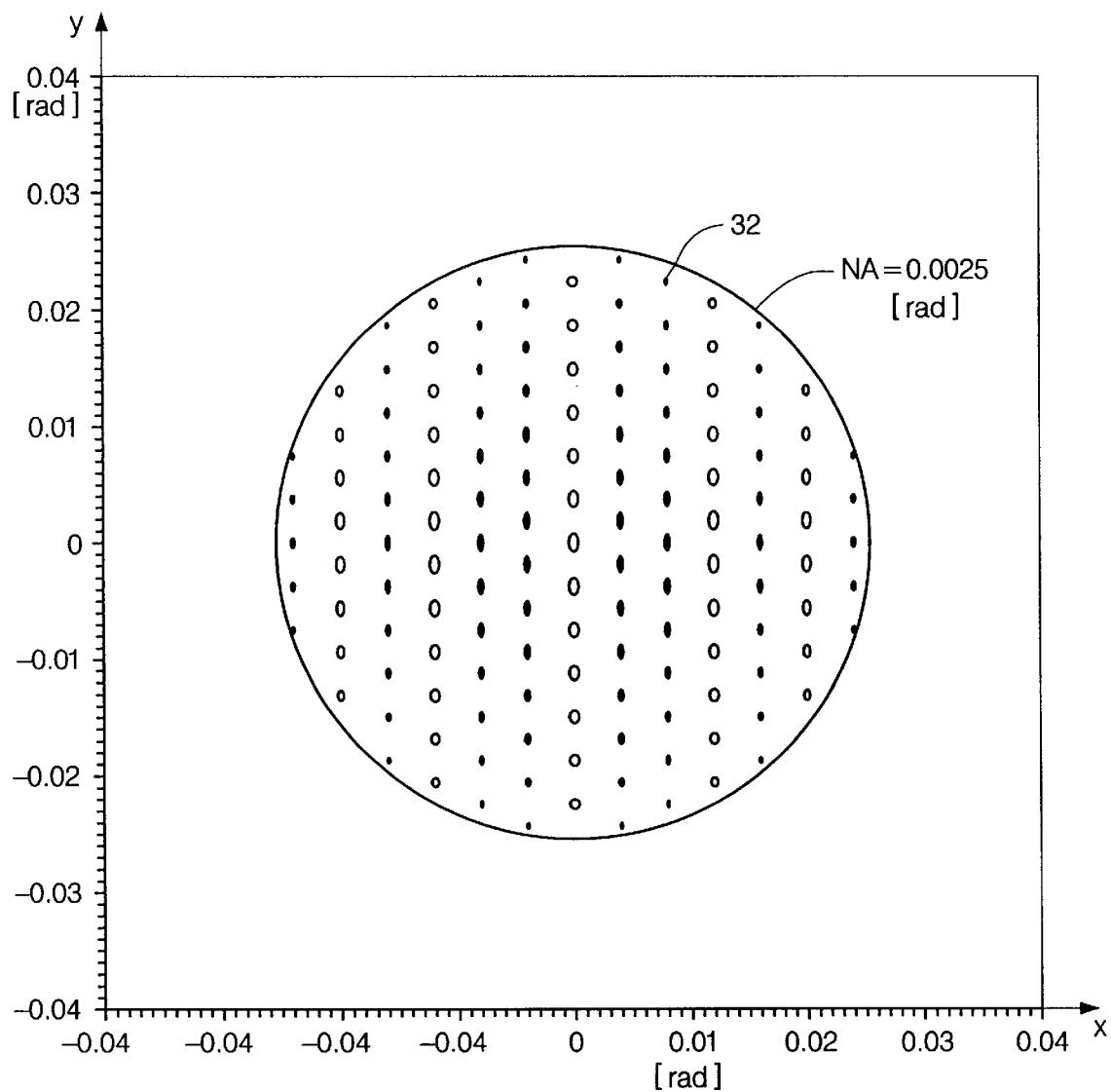
FIG. 17 shows the pupil illumination for a field point in the center of the field of a system according to FIG. 13.

The illumination of rectangular field 30 (106 mm×6 mm) in the temporary image plane is shown in FIGS. 15 and 16. FIG. 17 shows the pupil illumination 32 for a field point in the center of the field. The beam angles are referred to the principal beam. In the case of the arrangement of the field raster elements, it is advantageous that in the case of an aspect ratio of 4:1, the total grid is produced by two rectangular grids, which are shifted in the x-direction by one-half of the side length and in the y-direction by one entire side width. This measure leads to a uniform distribution of tertiary light sources 32 in comparison to an arrangement on a pure rectangular grid with a row/column arrangement of the field raster elements. According to the raster element distribution on the raster element plate, two grids of tertiary light sources 32 being shifted by one half side length distribution are provided. The tertiary light sources 32 are slightly elliptical in the y-direction, since the light source is imaged at different magnifications in the sagittal and tangential image planes.

The influence of field lens group 50 comprising one or more field lenses or field mirrors and the method of backward calculation to determine the position of the field raster elements on the field raster element plate or the cylinder raster element plate with the previously indicated distribution of tertiary light sources in the exit pupil will be described in detail on the basis of the following FIGS. 18 to 22.

The field lens group, comprising at least one field lens or one field mirror particularly fulfills the following tasks in the EUV-illumination system:

Conversion of the rectangular field to an annular field.

Adjustment of the telecentric condition, i.e., adapting of the exit pupil of the illumination system to the entrance pupil of the objective.

Correction of the uniformity of scanning energy.

In the case of splitting into a plane with sagittal secondary light sources and a plane with tangential secondary sources, the field lens group with field lenses or field mirrors 50 can be designed in such a way that both the sagittal as well as the tangential secondary light sources are imaged in the pregiven exit pupil. It is also possible that a diaphragm plane is situated at the location of the sagittal secondary light source, at the location of the tangential secondary light source or in between and is imaged in the pregiven exit pupil. For critical Köhler illumination, the diaphragm plane is advantageously arranged at the location of the sagittal secondary light sources. Masking devices or an aperture diaphragm can be arranged in this diaphragm plane. If the field mirrors are configured as grazing-incidence mirrors, then they may have a basic toroidal form. As explained previously, the field lens or the field mirror 50 images the secondary light sources 7, 9 or a diaphragm plane in the exit pupil of the illumination system, which here coincides with the entrance pupil of the following projection objective.

Figure 18:
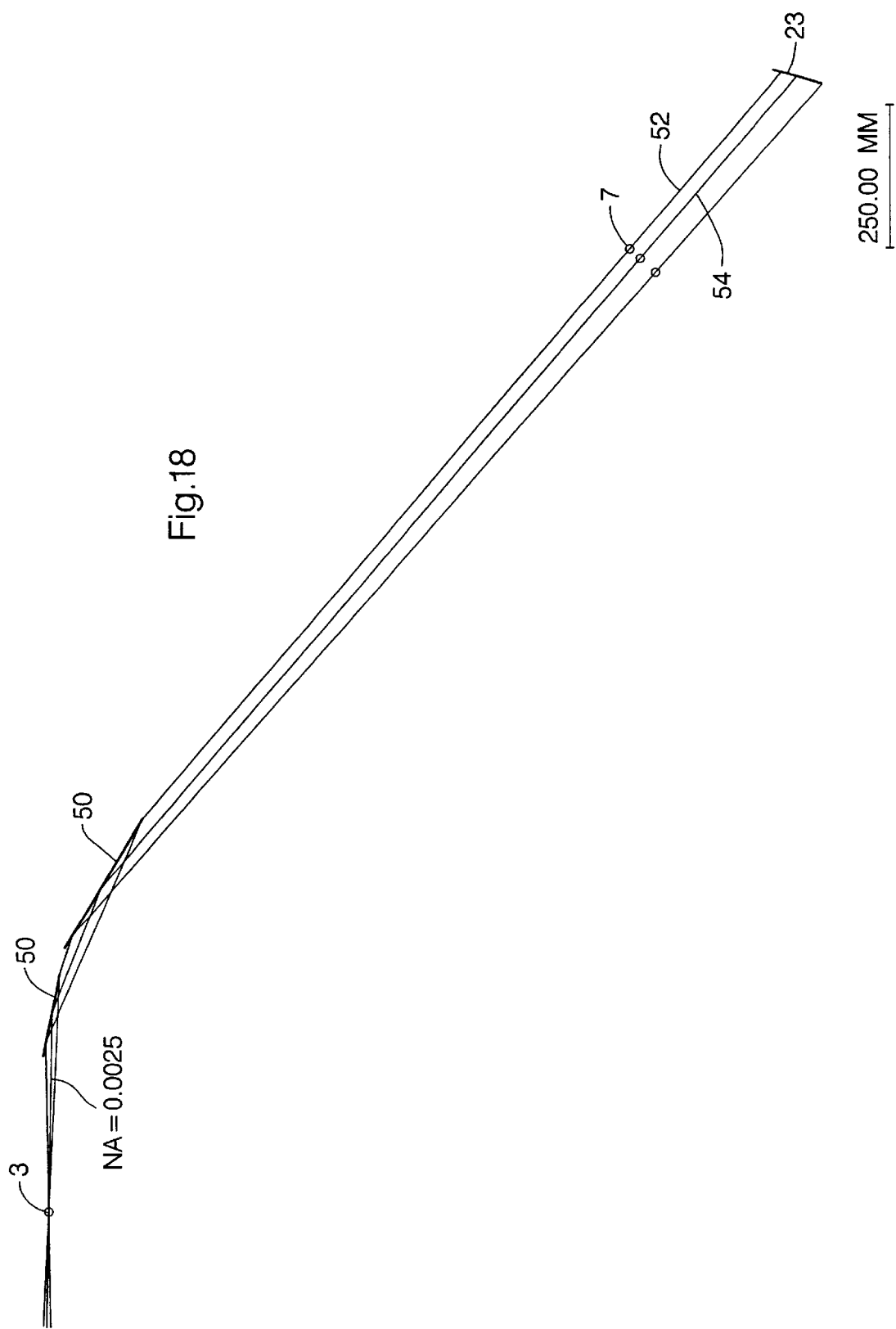
FIG. 18 shows the path of the marginal rays with NA=0.025 of a configuration with aspect ratio 4:1 of a backward calculated system.

FIG. 18 shows a part of the illumination system plotted against the direction of light: reticle 3, a field lens group with two field mirrors 50, tangential secondary light source 7 and raster element plate 23.

In the drafting of a design of an EUV-illumination system according to the invention, the design of the field lens or of the field mirror is determined first in the forward direction by imaging the central field raster element in such a way that the pregiven annular field is produced and the image of the tangential and sagittal secondary light sources formed by the central field raster element lies in the center of the exit pupil. The central field raster element is found in the center of the field raster element mirror. The optical axis runs through the center of the central field raster element. Now if a central ray 54 and the two marginal rays 52 are calculated counter to the direction of light from a point on the optical axis beginning in the reticle plane 3 for a system with field mirrors 50, then it is shown that the point of incidence of the central beam on the raster element plate does not lie centrally between the points of incidence of the marginal rays.

Figure 19:
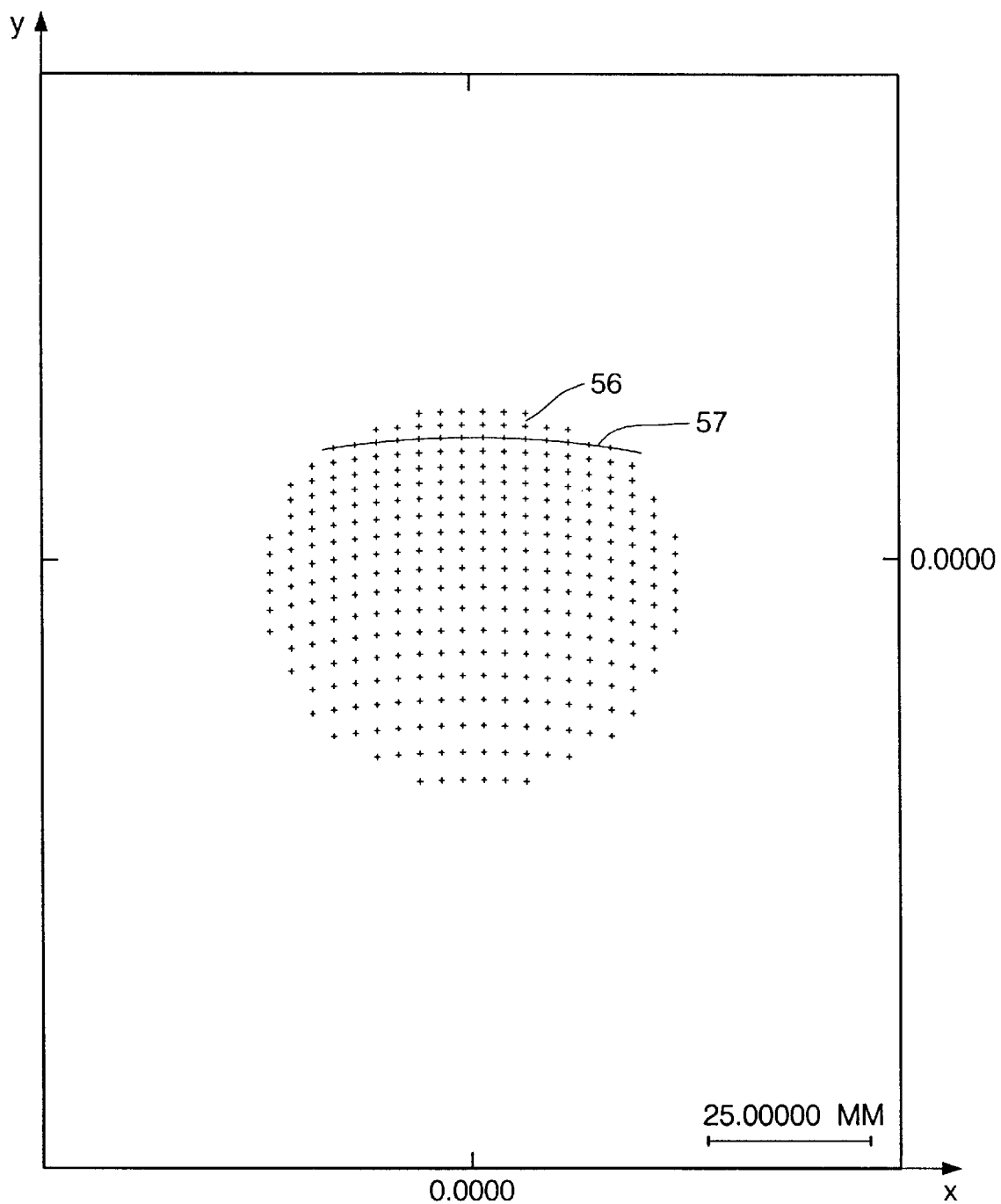
FIG. 19 shows the intersection points of a backward calculated ray grid in the raster element plane in a configuration of the invention according to FIG. 18.

If one calculates a ray grid with ray angles situated on a quadratic grid with NA=0.025, starting from the center point of the reticle plane for a system with such field mirrors 50 and tracing them backward, then FIG. 19 shows that the intersection points lie on curved lines 57. The distances of the rays are furthermore distorted.

This distortion becomes important on the other hand, if one proceeds from a regular field raster element. So the arrangement of the tertiary light sources in the exit pupil will be distorted.

Figure 20:
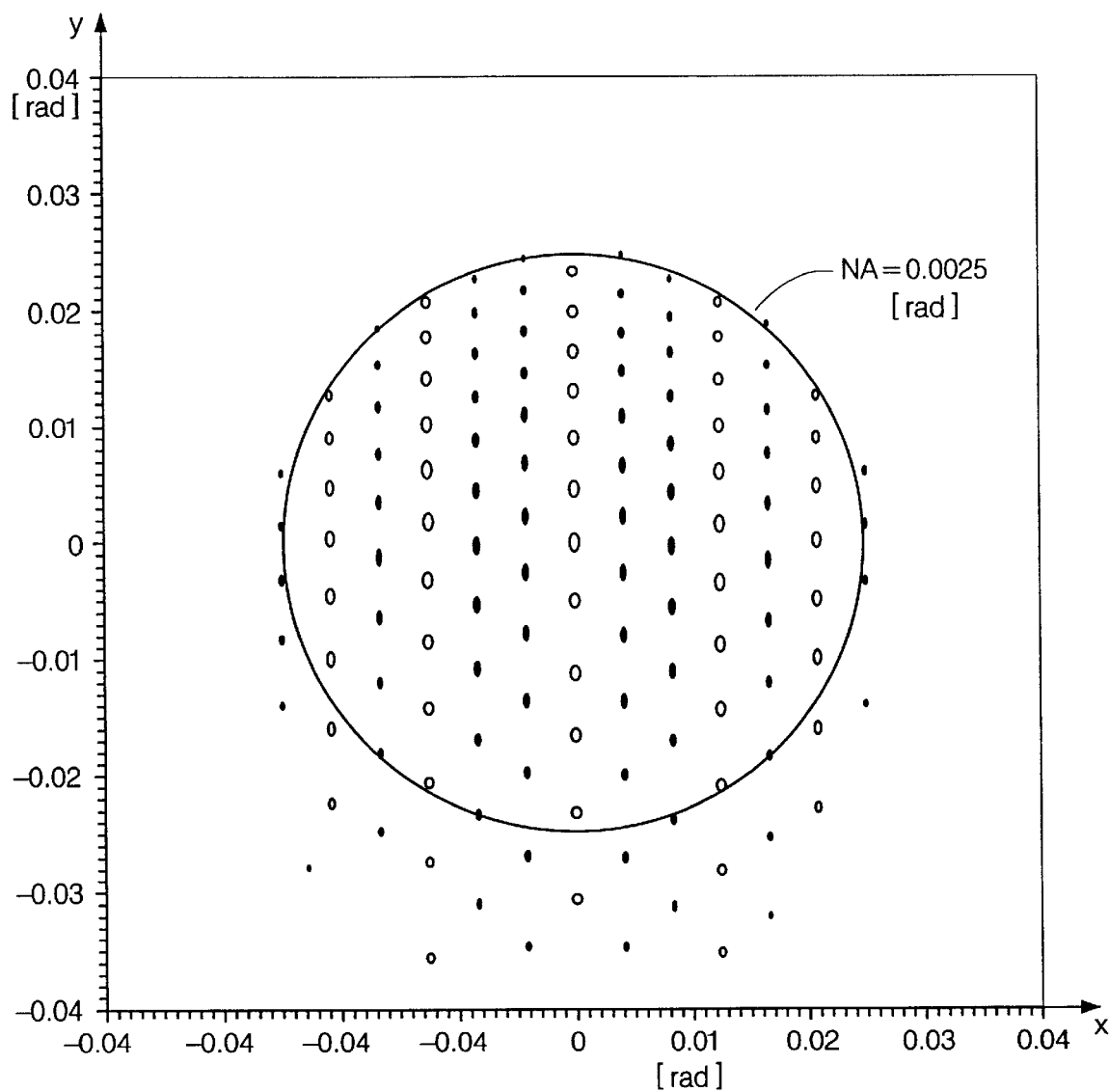
FIG. 20 shows the pupil illumination of a system with uniform distribution of field raster elements.

If the field raster elements are arranged on two rectangular grids displaced relative to one another and the tilt angle of the raster elements is adjusted such that the central beams intersect the reticle plane on the optical axis, then a pupil illumination results for such an arrangement for one point in the center of the reticle plane, as shown in FIG. 20. It can be clearly seen that the position of the tertiary light sources is distorted in the y-direction based on the pupil aberrations of the field mirrors. In the positive y-direction, the tertiary light sources are pushed together, while in the negative direction, they are pulled apart.

In order to achieve a regular distribution of the tertiary light sources in the exit pupil of the illumination system, a regular distribution of the tertiary light sources is defined in the exit pupil of the illumination system, which here coincides with the entrance pupil of the objective; then a ray trace backward is made.

As described previously, an arrangement of tertiary light sources, which are here the images of the secondary sources, is given in advance in the exit pupil of the illumination system. Then, in order to determine the position of the field raster elements on the field raster element plate or the cylinder raster element plate, the principal beam of the tertiary light sources is calculated from the field lens to the raster element plane, i.e., to the field raster element plate, whereby the intersection points of the principal beams with this plane determines the position of the field raster elements. The direction of the backward traced principal rays is given by the location of the tertiary light sources and the fact that the principal rays run through the center of the reticle plane.

Figure 21:
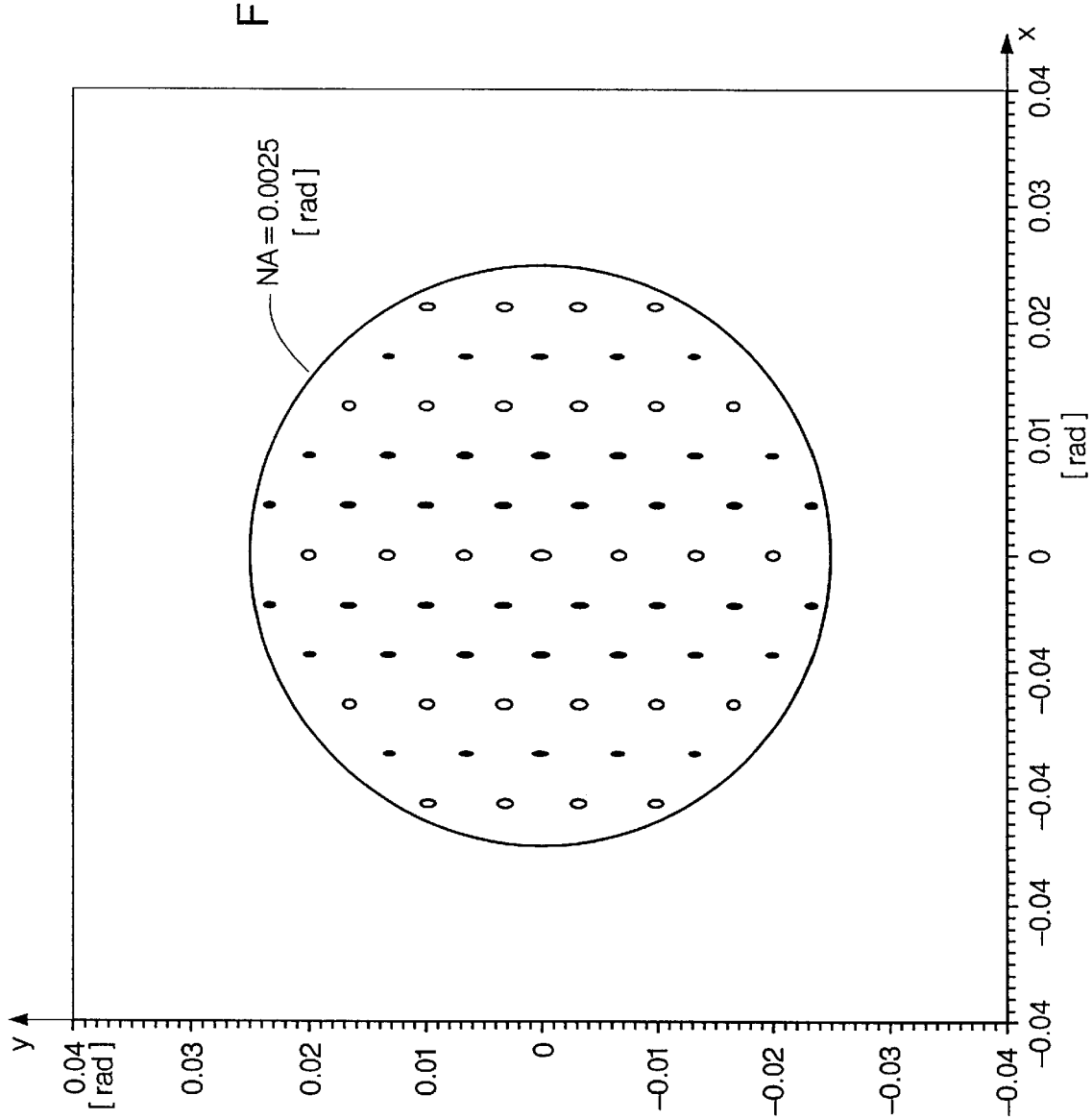
FIG. 21 shows the pupil illumination of a system with nonuniform distribution of field raster elements.
Figure 22:
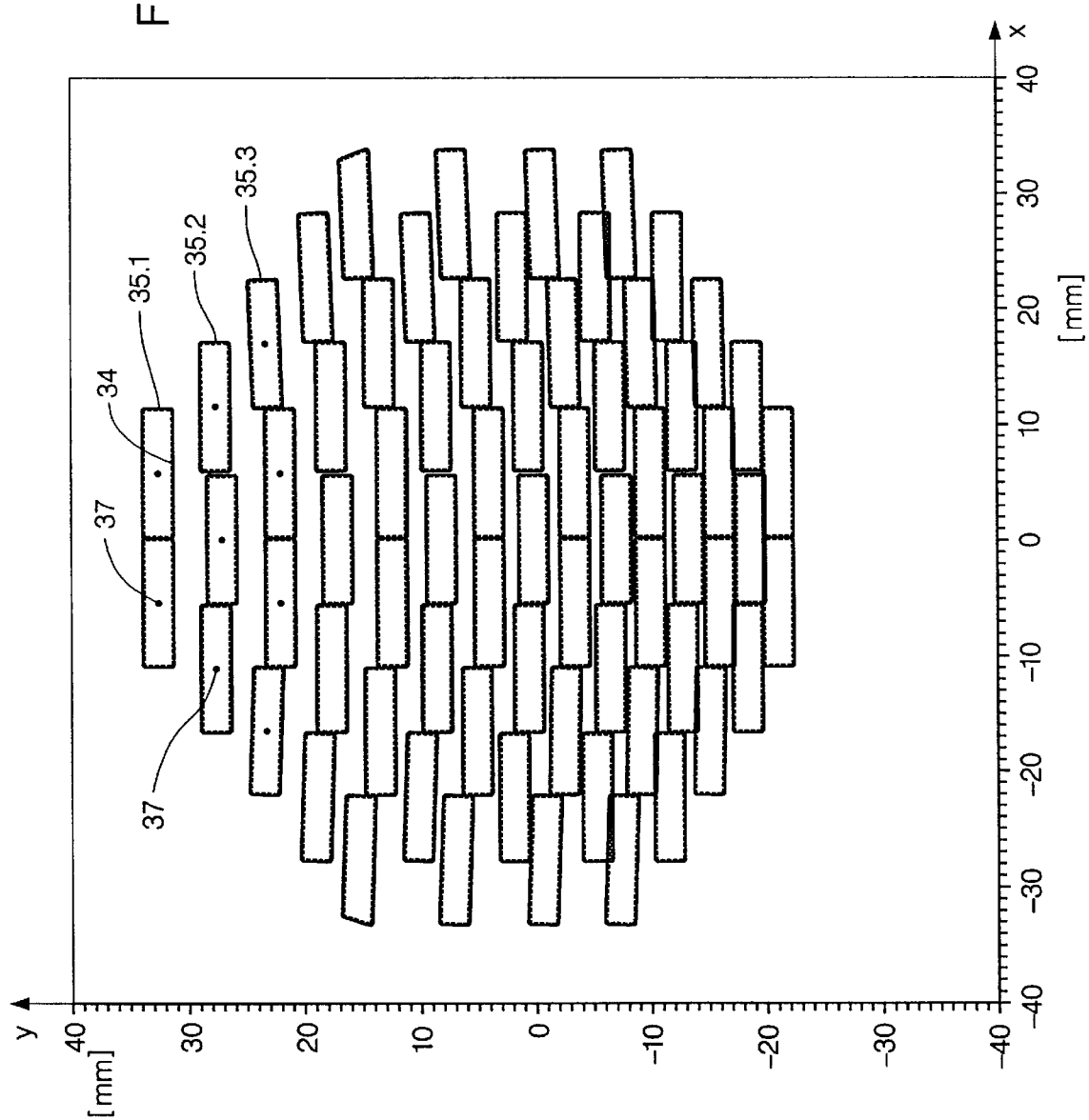
FIG. 22 shows the distribution of the 4:1 raster elements onto a field raster element plate, which leads to a pupil illumination according to FIG. 21.

If one uses as a basis the pupil illumination shown in FIG. 21 for the field center, then the distribution of the 4:1 field raster elements 34 shown in FIG. 22 results. While the field raster elements 34 are tightly packed in the y-direction in the lower part of the raster element plate, their distance increases toward the top. In this way, gaps are formed between the field raster elements in the y-direction, which lead to an transmission efficiency of η≈60%. The raster element arrangement is superimposed by the rotation-symmetric illumination distribution of the collector mirror as an elevation line profile. An intensity tilt in the pupil illumination is to be expected due to the asymmetric arrangement of the field raster elements in the y-direction. It can be compensated by appropriately adapting the reflectivities of the raster elements. It is also possible to configure the source and collector unit in such a way that a symmetric pupil illumination is produced despite the distorted raster element arrangement.

FIG. 22 additionally shows the arrangement of field raster elements 34 in curved running rows 35.1, 35.2, 35.3, etc. Each row of field raster elements 35.1, 35.2, 35.3, etc. comprises more than one field raster element 34. The central point 37 of field raster elements 34 of two rows next to one another, for example, rows 35.1 and 35.2, are shifted opposite one another in the x-direction for a more uniform filling of the pupil. The shift here amounts to one-half of the raster element length in the x-direction. It can also be well recognized in FIG. 22 that there is a decrease in the distance of the individual rows 35.1, 35.2, 35.3, etc. in the negative y-direction until the field raster elements 34 of the individual rows lie directly next to one another without any distance between them in the lowermost row.

The light-beam path and the intensities for the total system of laser-plasma source 20, collector 22, field raster element plate 100, field lens group 50, reticle and exit pupil, which was designed as described previously, are shown below in FIGS. 23 to 28.

Field raster element plate 100 was designed, as described above, with 4:1 field raster elements in distorted arrangement.

Figure 23:
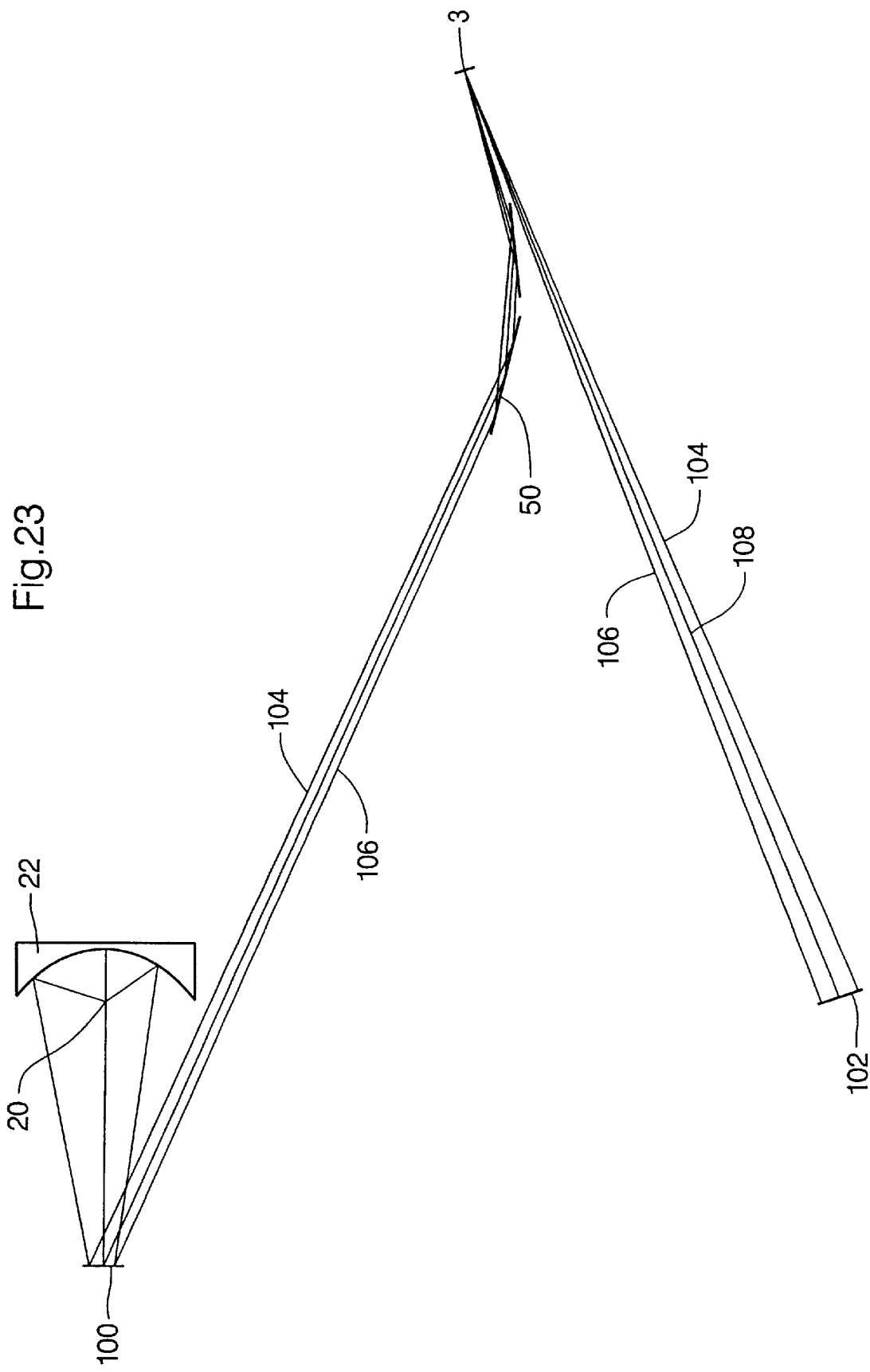
FIG. 23 shows the marginal rays from the reticle to the exit pupil of the illumination system comprising light source, collector, cylindrical raster element plate, field lens, and exit pupil of the imaging objective.

The marginal rays 104, 106 of the total system shown in FIG. 23 impinge on reticle 3 and are shown up to the entrance pupil of objective 102. They run symmetrically to central ray 108 for the first time after field lens group 50. In this manner, collector 22 is asymmetrically illuminated relative to the optical axis. The angular characteristic of the source should be aligned correspondingly for compensation purposes.

Figure 24:
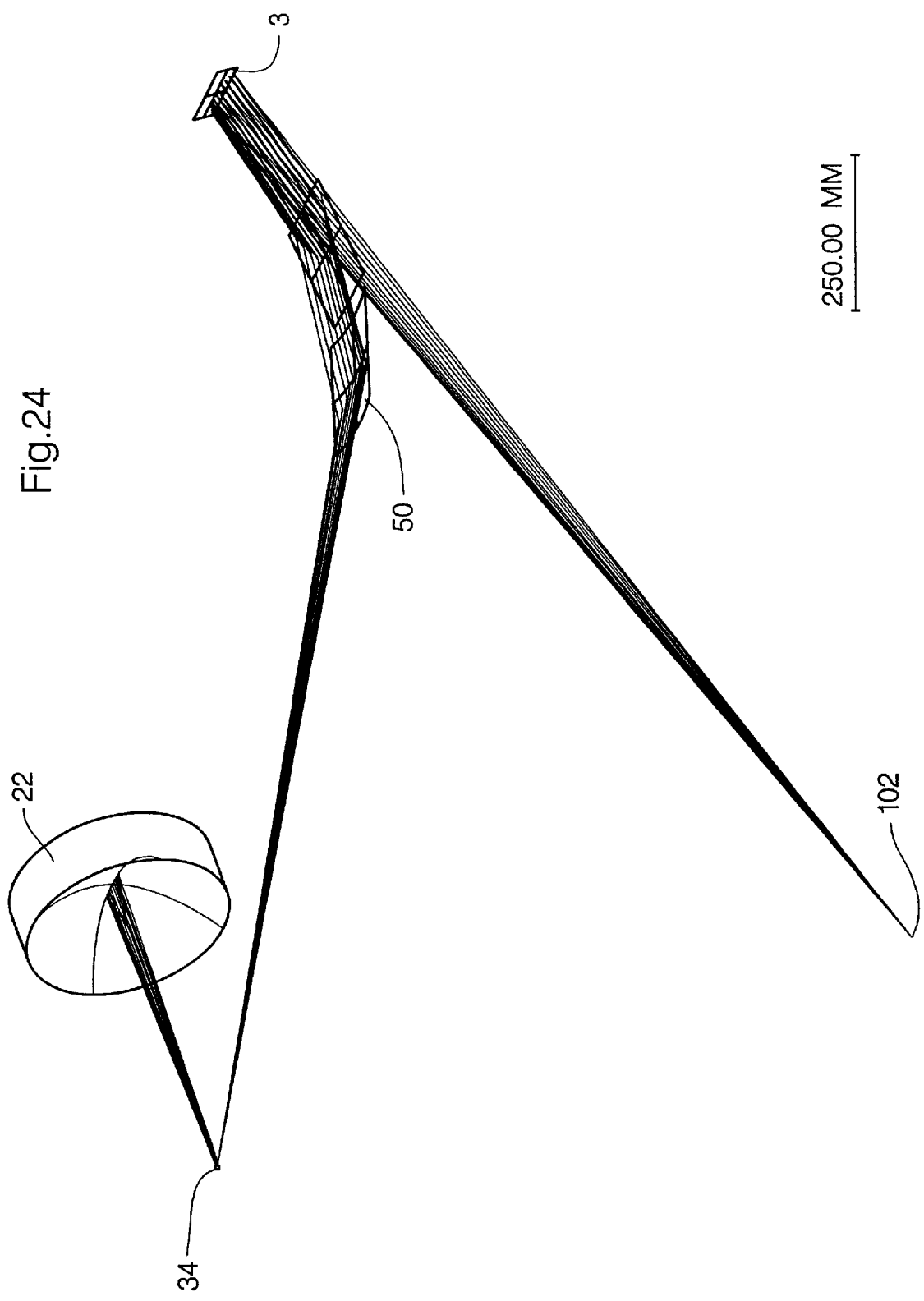
FIG. 24 shows the path of the sagittal radiation for a system according to FIG. 23.

A bundle of sagittal beams, which impinges the central cylinder raster element (0, 0) 34 of the field raster element plate is shown in FIG. 24. The beams illuminate the ring on the reticle with the correct orientation and meet in the entrance pupil of objective 102.

Figure 25:
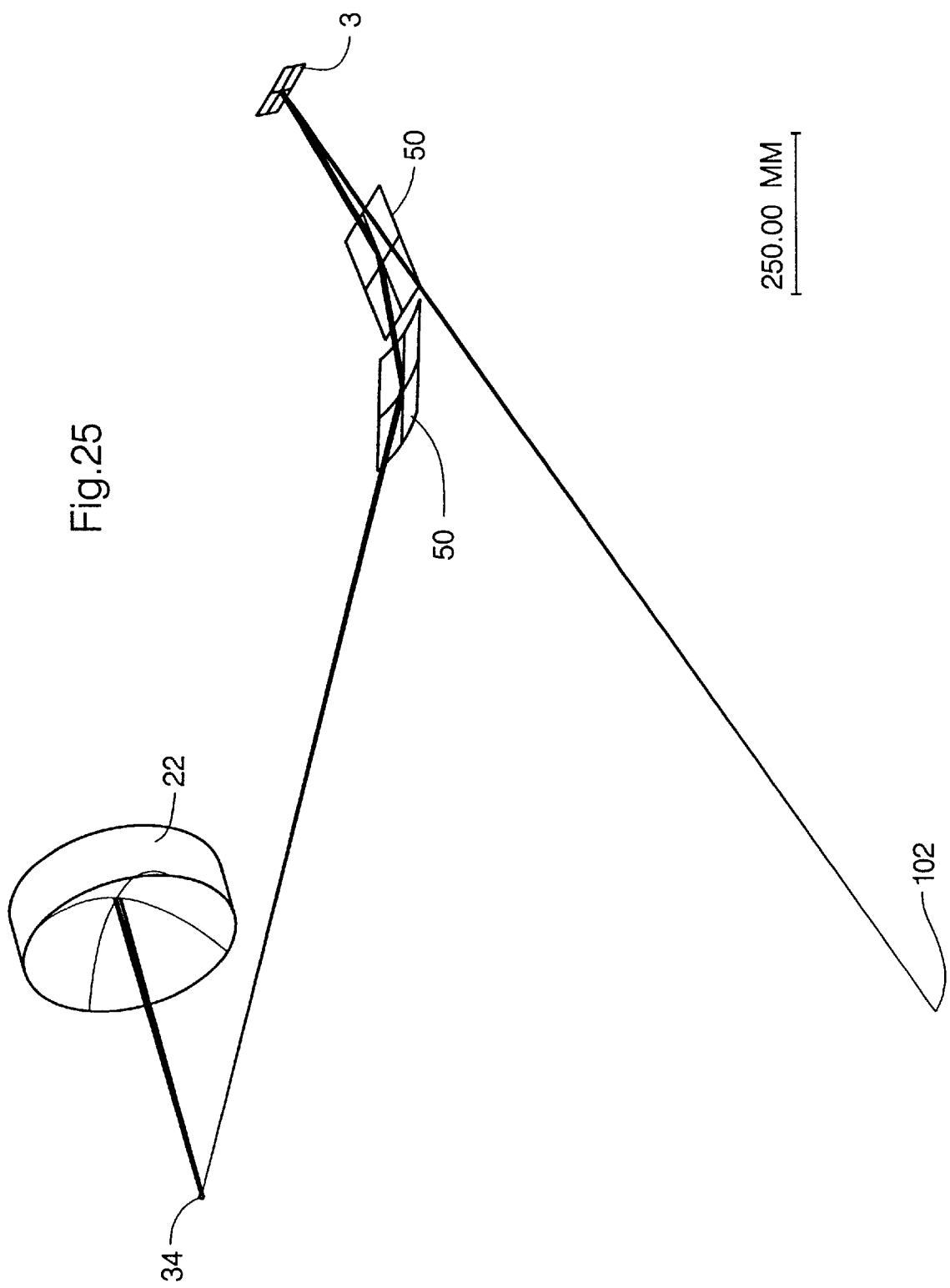
FIG. 25 shows the path of the tangential radiation for a system according to FIG. 23.

FIG. 25 shows a bundle of tangential beams, which strikes the central cylinder raster element 34. The beams illuminate the ring along the y-axis and meet also in the entrance pupil of objective 102.

Figure 26:
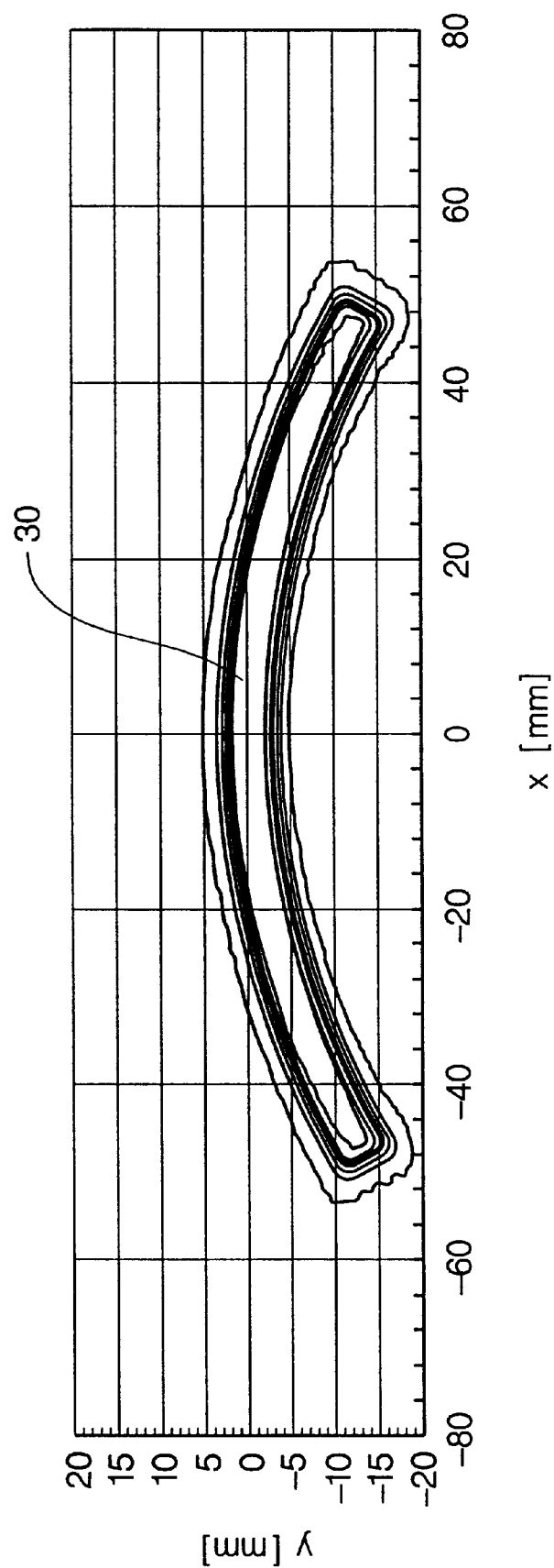
FIG. 26 shows the illumination of the reticle with an illumination system according to FIG. 23.

The illumination of the reticle with annular field 30 (R=100 mm, segment=60°, field width ±3.0 mm) is shown in FIG. 26.

Figure 27:
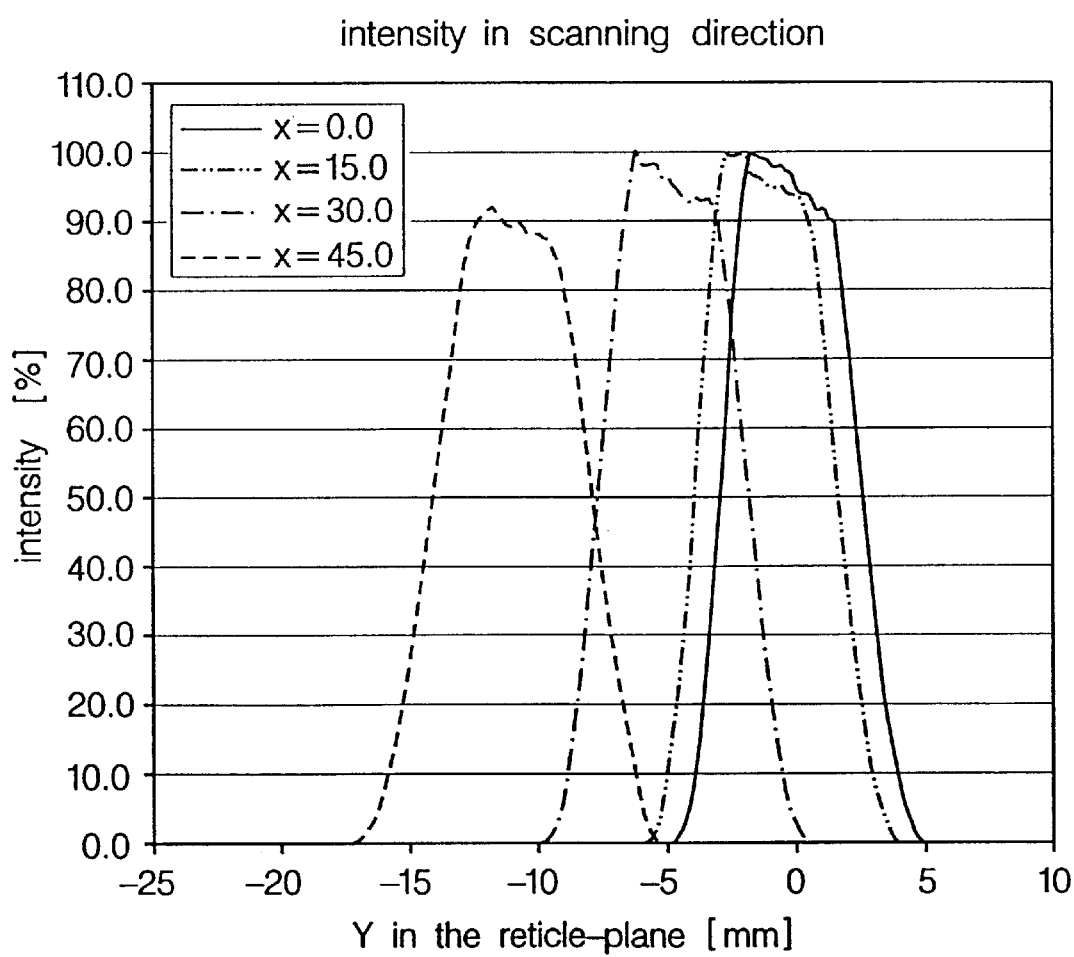
FIG. 27 shows intensity sections parallel to the y-axis of a system according to FIG. 23 for a 50-$\mu$m source.

FIG. 27 shows intensity sections parallel to the y-axis at x=0.0 mm, 15.0 mm, 30.0 mm and 45.0 mm. The maximum intensity slightly decreases toward the edge of the field, in this case from 100% to 92%. The y-width of the intensity distributions increases by 15% toward the edge of the field, based on the ring geometry.

Figure 28:
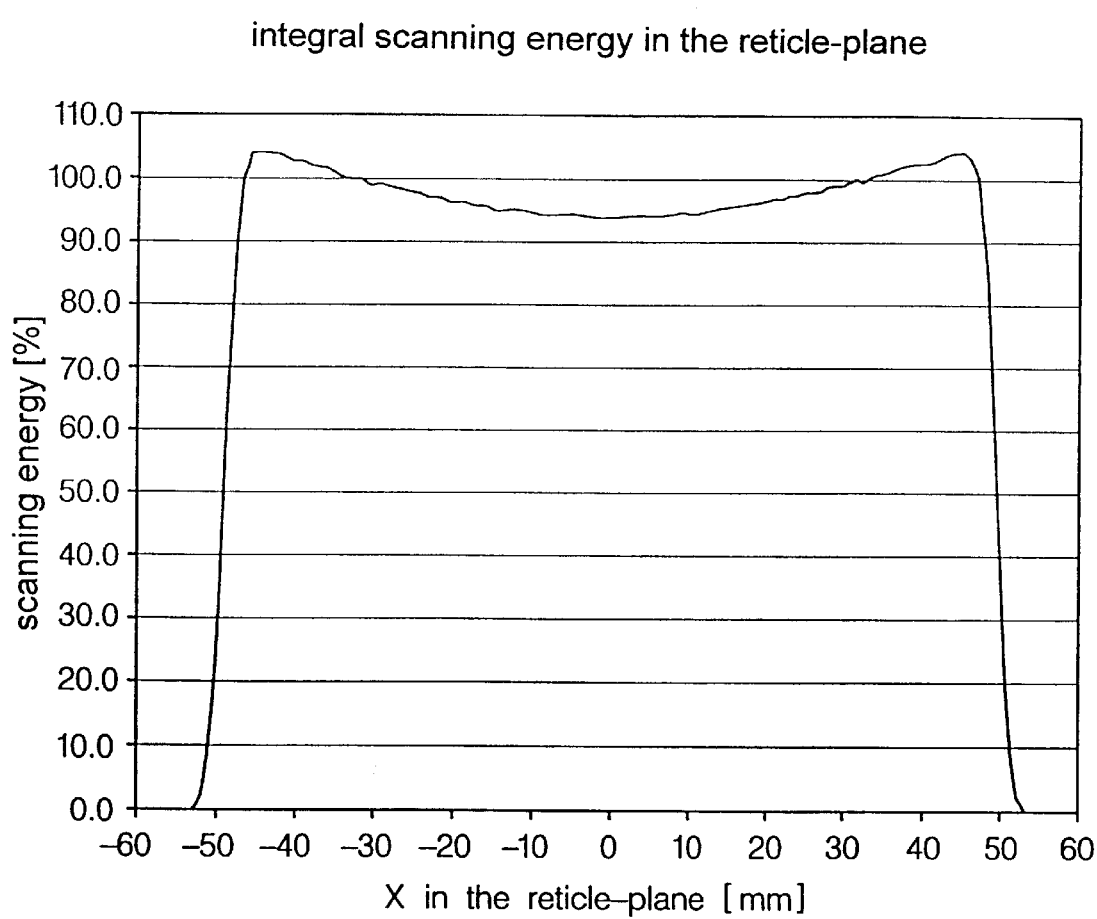
FIG. 28 shows the integral scanning energy of a system according to FIG. 20.

The integral scanning energy, i.e., the integration of the intensity along the scanning path, which is an important factor for the lithography process, is shown in FIG. 28. The integral scanning energy varies between 95% and 105%. The uniformity $\mu$mounts to ±5.0%. The uniformity loss is partly due to the geometry of the ring, since the scanning path increases by approximately 15%. A part of this increase could be compensated for by a decrease in the absolute intensity toward the edge of the field, due to the design of the field lens group.

Alternatively or simultaneously to this, a homogeneous course of scanning uniformity can also be achieved by correspondingly adjusting the reflectivities of the individual raster elements. The reflectivity on each raster element varies at least along the x-direction.

The forms of embodiment 1 and 2 of the invention, which are described in FIGS. 8 to 28 comprise a plasma light source with a source diameter of 50 $\mu$m as the light source. With such light sources that extend only by a small mount, the illumination is Köhler-like and the pupil raster elements can be omitted. The raster element imaging is produced in a way similar to that of a camera obscura. In sources with larger diameters, the field raster elements can be imaged onto the field by means of pupil raster elements. Without the pupil raster elements, there would be a broadening of the edges or a blurring of the reticle illumination. Cylinder raster elements or toroidal raster elements may be used as pupil raster elements. The edge sharpness of the field raster element images in the y-direction can be improved with cylinder raster elements in the tangential pupil plane.

Examples of embodiment 3 and 4 with sources having a source diameter of 100 $\mu$m will be considered below.

A source with an extent of 100 $\mu$m was used as the light source, which radiates in the solid angle 2 π.

The aspect ratio of the field raster elements according to Example of embodiment 3 amounts to 17.5:1. Four raster elements are arranged per row on the field raster element plate.

The size of the field to be illuminated amounts to 105 mm×6 mm (30° segment with a base radius of 200 mm).

Figure 29:
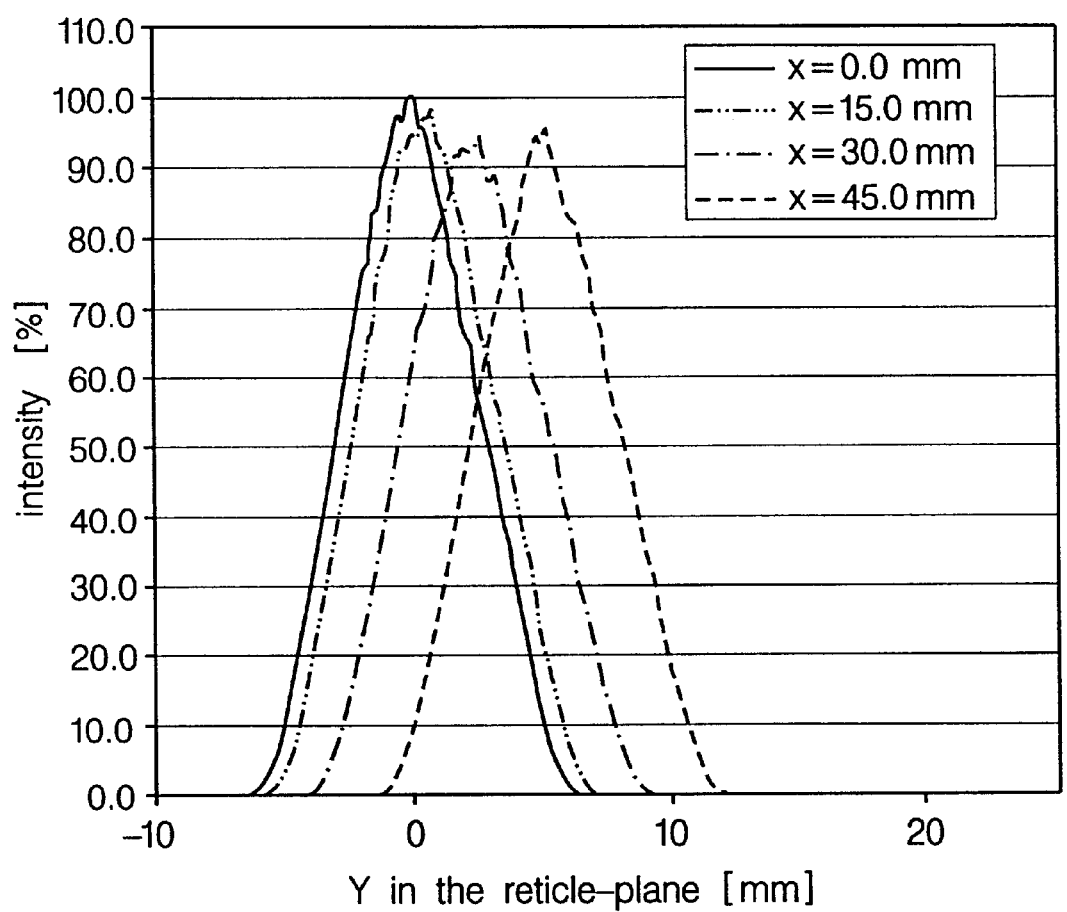
FIG. 29 shows intensity sections parallel to the y-axis of a system according to FIG. 23 with a 100-$\mu$m light source with Köhler illumination and planar facets as field raster elements with aspect ratio 17.5:1.

FIG. 29 shows intensity sections along the y-direction (scanning direction) for various x-values for a system with Köhler illumination in the x- and y-directions.

The 100-$\mu$m source leads to an edge sharpness of 7.2 mm.

In the case of the Köhler illumination as shown in FIG. 29, the edge broadening leads to the result that the intensity plateau is not reached, since the edge broadening is already wider than the field to be illuminated. The base of the intensity distribution has a width of 13.2 mm.

Figure 30:
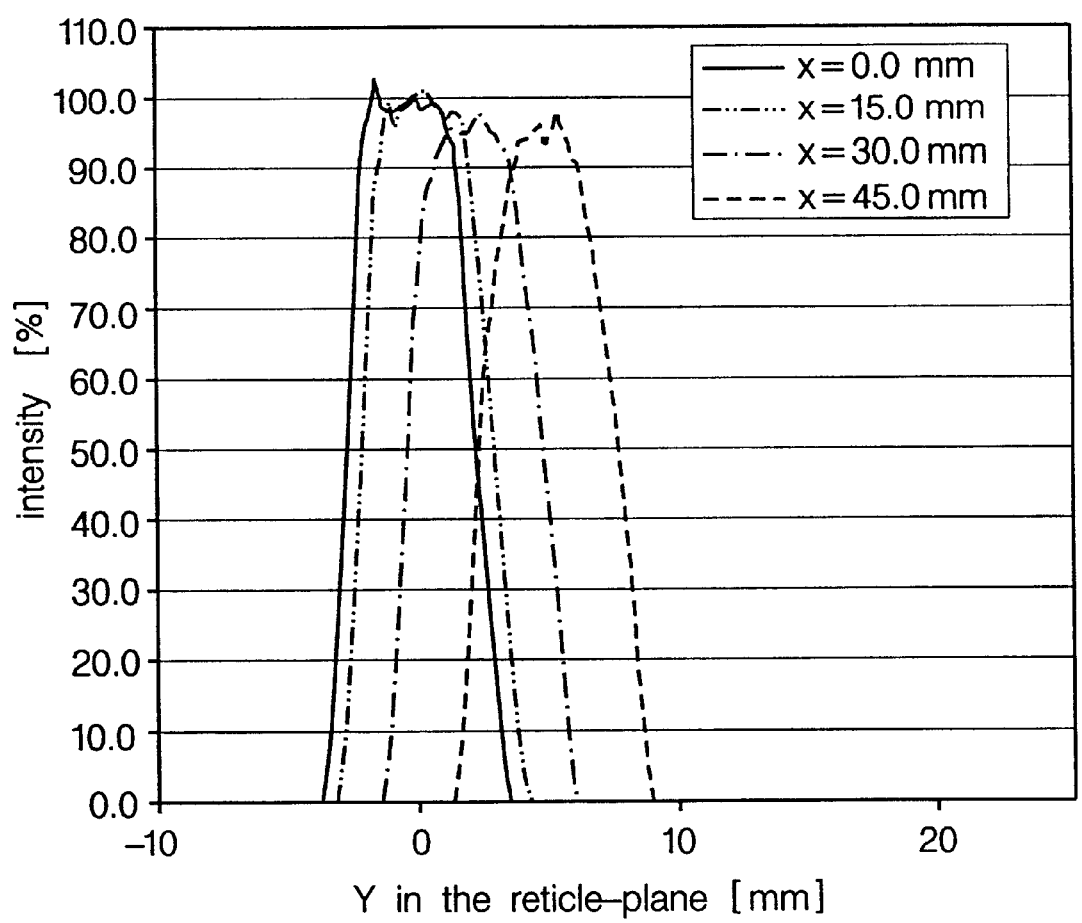
FIG. 30 shows intensity sections parallel to the y-axis of a system according to FIG. 23 with a 100-$\mu$m light source with critical Köhler illumination and cylinder raster elements as field raster elements with aspect ratio 17.5:1.

FIG. 30 shows intensity sections along the y-direction for different x-values for a system with critical Köhler illumination according to Example of embodiment 3.

The source size is 100 $\mu$m also for critical Köhler illumination, FIG. 30. Since the 100-$\mu$m source is imaged on a source image with diameter of 7.2 mm, the base in this case has a width of 7.2 mm.

Figure 31:
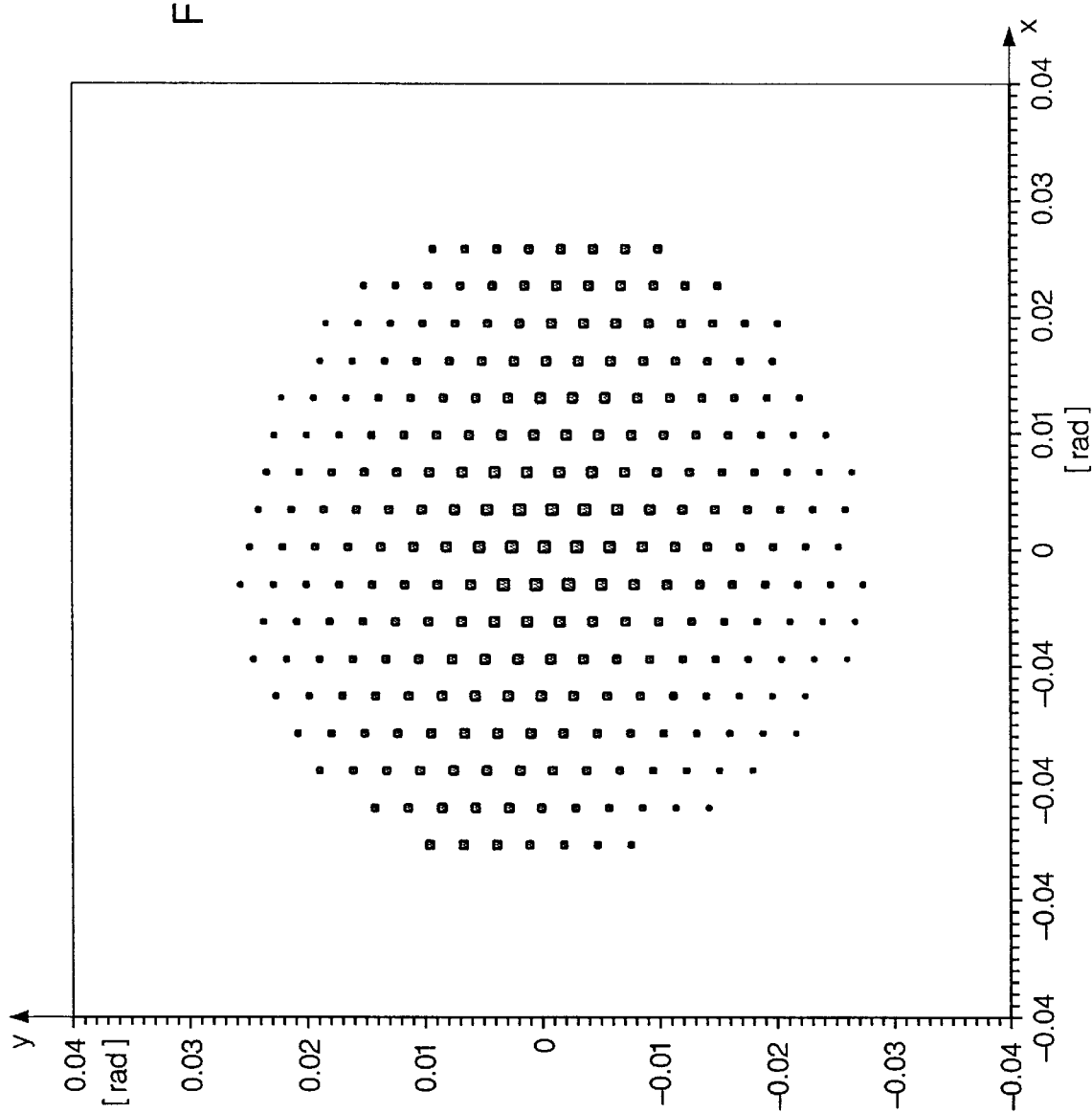
FIG. 31 shows the pupil illumination of a system according to FIG. 30.

FIG. 31 shows the pupil illumination of an arrangement according to FIG. 30 for a field point at the center of the field. The tertiary light sources are distributed according to the arrangement of field raster elements. Each row of field raster elements is shifted relative to its adjacent rows, by ¼ of the raster element length, on the field raster element plate. Without the shift in the raster element rows, transmitted lines would result in the pupil distribution, as known, for example, from U.S. Pat. No. 5,677,939.

Figure 32:
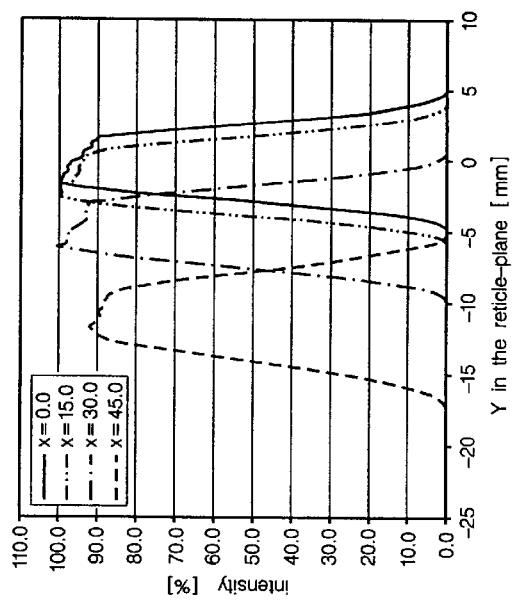
FIG. 32 shows the intensity sections parallel to the y-axis of a system according to FIG. 23 with a 100-$\mu$m light source with critical Köhler illumination and cylindrical raster elements as field raster elements with aspect ratio 4:1.

FIG. 32 shows intensity sections along the y-direction for different x-values for critical Köhler illumination, whereby the field raster elements have an aspect ratio of 4:1 according to Example of embodiment 4. In Example of embodiment 4, the field lens group was designed for a 60° segment with a base radius of 100 mm. In this manner, the y-offset of the intensity sections relative to the field edge and the geometric broadening of the scanning path becomes larger than in the example of embodiment 3.

The intensity section according to FIG. 32 at x=0 mm shows the same width of 7.2 mm for a 100-$\mu$m source, as in the case of the 17.5:1 raster elements, since the magnification of the source is independent of the raster element aspect ratio and in principle depends only on the aperture on the side of the source and reticle.

Figure 33:
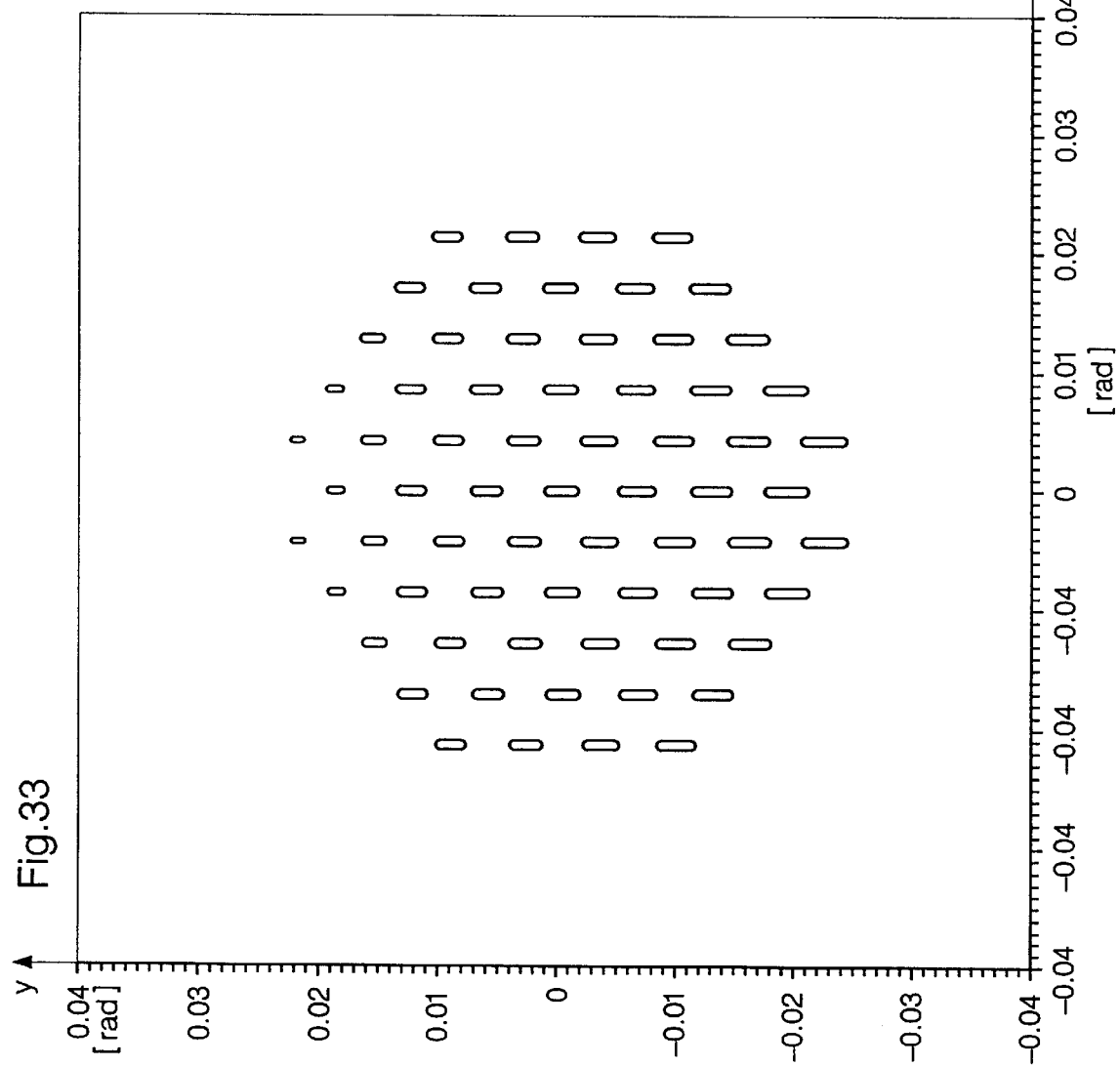
FIG. 33 shows the pupil illumination of a system according to FIG. 32.

The pupil illumination shown in FIG. 33 for a field point at the center of the field for raster elements with aspect ratio of 4:1 is characterized by line-shaped tertiary light sources, which are typical for critical Köhler illumination systems. The lines are appropriately displaced by shifting each field raster element row by half a raster element length relative to its adjacent rows.

The very uniform arrangement of the tertiary light sources in the exit pupil of the illumination system according to Example of embodiment 4 was achieved by a distorted arrangement of the field raster elements.

A possible additional form of embodiment of the invention consists of transferring the anamorphotic effect of the individual field raster elements of the field raster element plate to the collector mirror. This makes it possible to use planar facets with simultaneously reduced aspect ratio. The x-section of the collector mirror images the source in the sagittal focus, and the y-section images it in the tangential focus.

Figure 34:
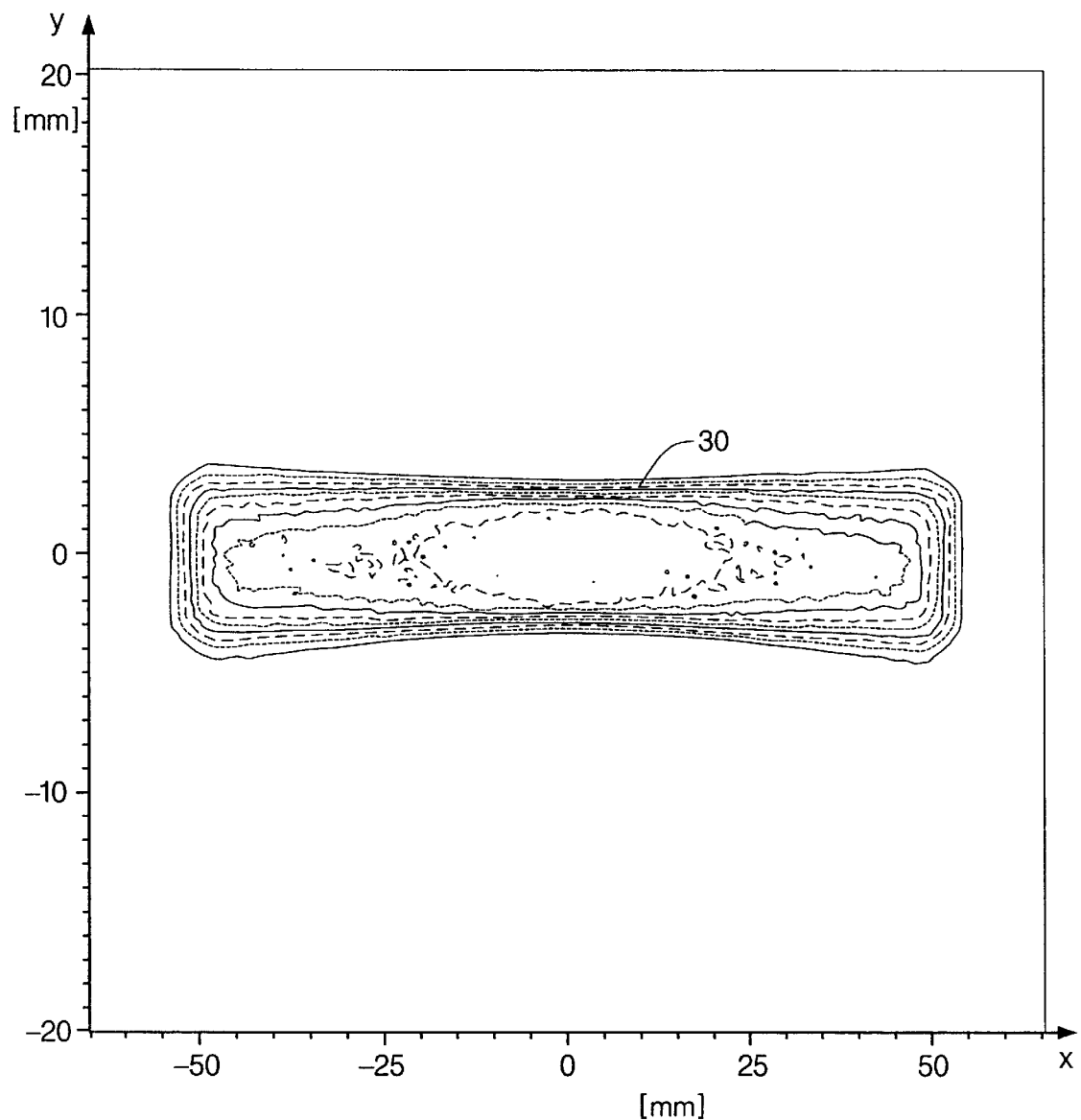
FIGS. 34, 35 show the illumination of a rectangular field in the temporary image plane of a system with astigmatic collector mirror and a raster element plate with planar raster elements.
Figure 35:
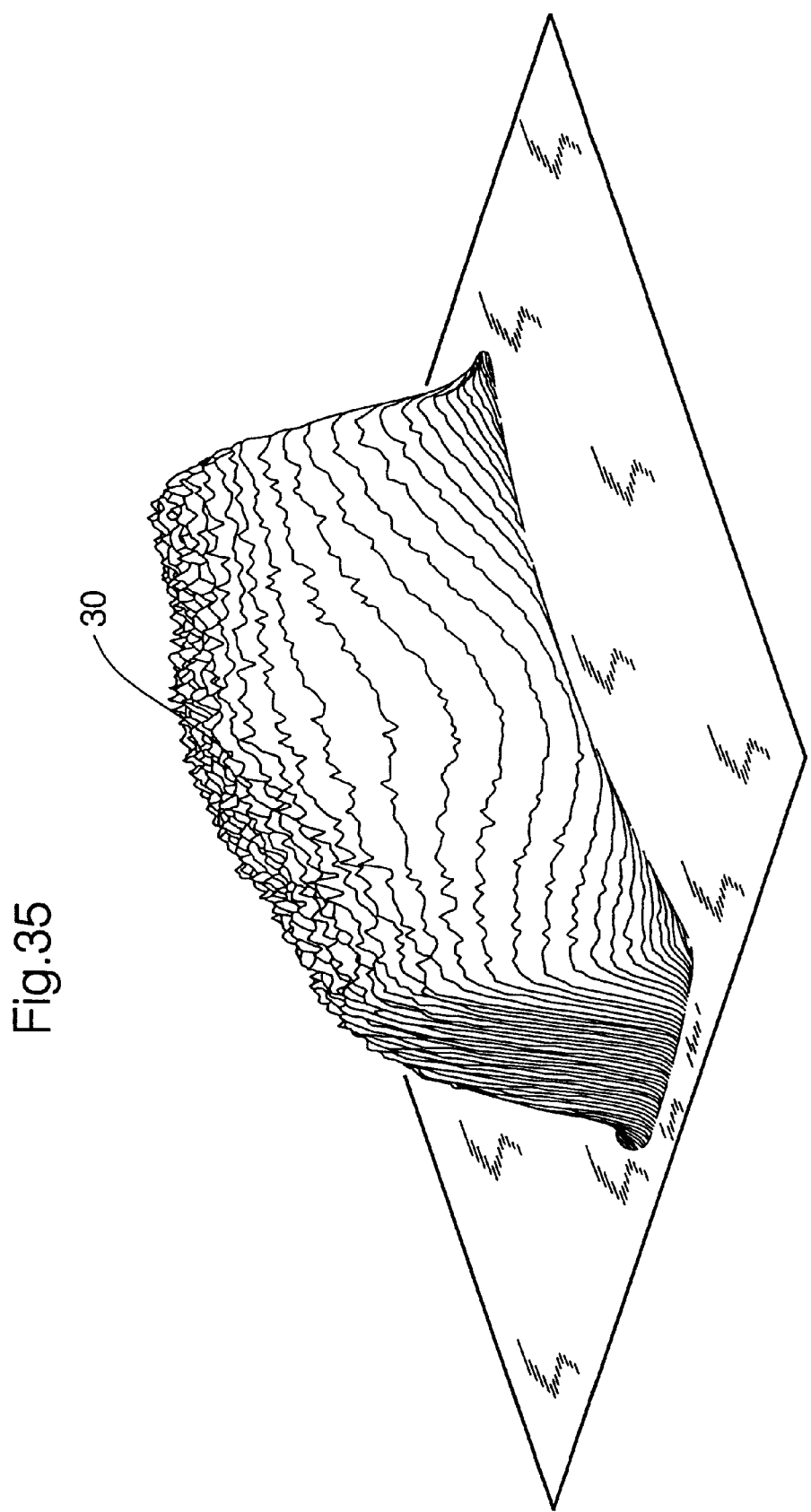

FIGS. 34 and 35 show the illumination of the rectangular field (106 mm×6 mm) in the temporary image plane of a device with a collector mirror, which has an anamorphotic effect. Thus, square field raster elements were used on a quadratic grid.

Figure 36:
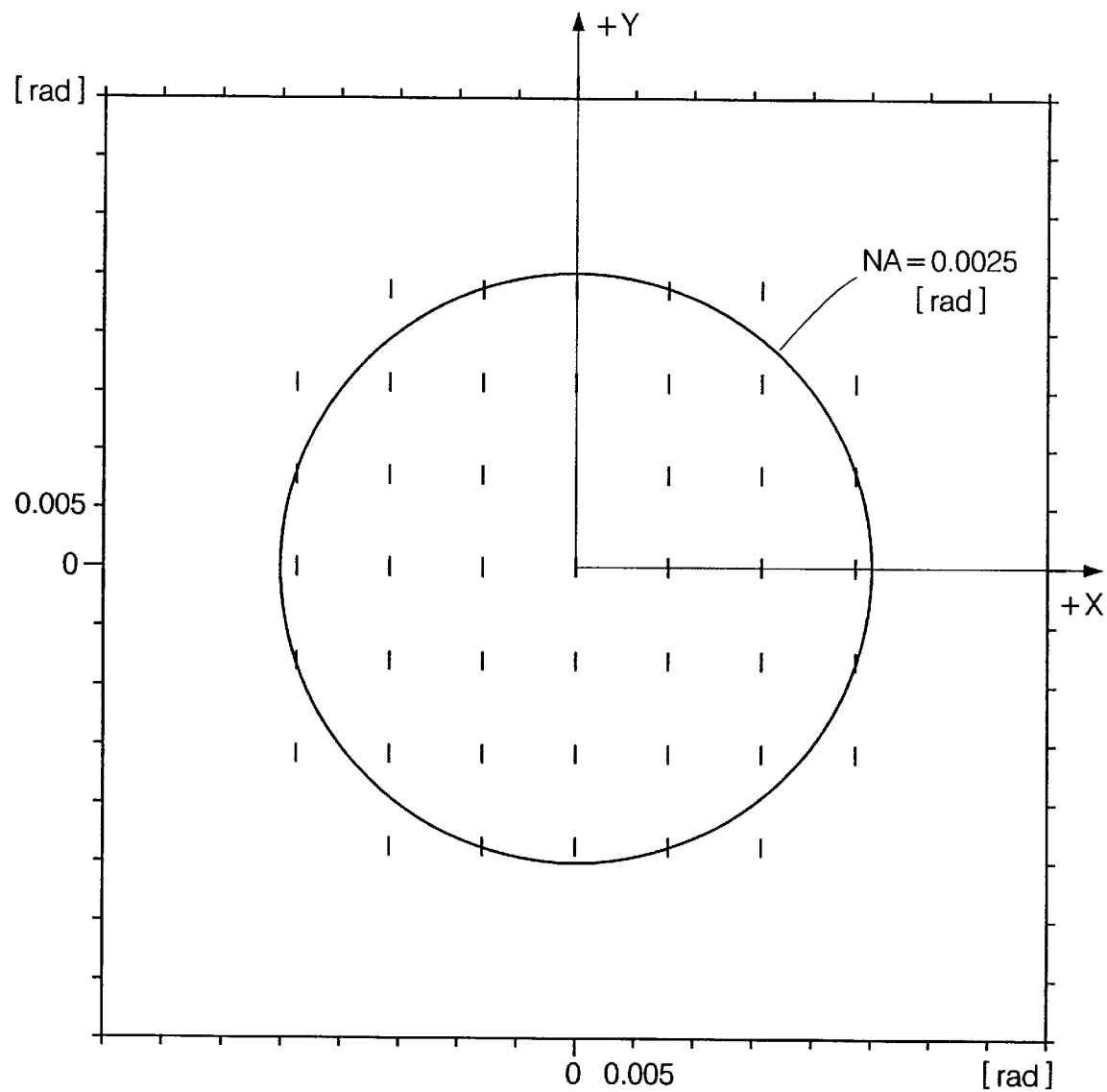
FIG. 36 shows the pupil illumination of a system according to FIGS. 34 to 35 for a field point in the center of the field.

The pupil illumination for a field point in the center of the field is shown in FIG. 36. The ray angles are referred to the principal ray. A quadratic grid of secondary light sources results corresponding to the raster element distribution.

An EUV-illumination system is shown for the first time by the invention, in which the raster element aspect ratio of field raster elements can be reduced by means of components with an anamorphotic effect. In particular, the invention makes it possible for the first time to illuminate a field with aspect ratio greater than 1:1 with raster elements with smaller aspect ratio than the field aspect ratio. This results in a very considerable simplification of the manufacture of raster element plates. Another advantage of the invention can be seen from the fact that a simpler packing on the field raster element plate is possible due to the smaller aspect ratio of, for example, 4:1 or 1:1 of the individual field raster elements, and thus the tertiary light sources can be distributed more uniformly in comparison to a pure column-row arrangement in the case of raster elements with large aspect ratio, for example, of 17.5:1.

What is claimed is:

1. An illumination system for illuminating a field with an aspect ratio other than 1:1 in an image plane, comprising:
   a light source; and
   an optical component for transforming said light source into a secondary light source, wherein said optical component produces an anamorphotic effect that splits said secondary light source into a tangential secondary light source and a sagittal secondary light source;
   wherein said optical component has a first mirror or a first lens, having a raster element,
   wherein said raster element has an aspect ratio smaller than said aspect ratio of said field in said image plane, and
   wherein said raster element is imaged into said image plane.

2. The illumination system of claim 1, wherein said tangential secondary light source is situated between said sagittal secondary light source and said image plane.

3. The illumination system of claim 1, wherein said tangential secondary light source is situated in said image plane.

4. The illumination system of claim 1, wherein said raster element is one of a plurality of raster elements, wherein said first mirror or said first lens is divided into a plurality of rows, wherein each of said plurality of rows has several of said plurality of raster elements, and wherein said plurality of rows are displaced relative to one another.

5. The illumination system of claim 1, wherein said optical component has a collector unit, and wherein said collector unit has a collector mirror or a collector lens.

6. The illumination system of claim 5, wherein said collector unit produces said anamorphotic effect.

7. The illumination system of claim 6, wherein said collector unit splits said light source into said tangential secondary light source and said sagittal secondary light source.

8. The illumination system of claim 7, wherein said raster element has a planar optical surface.

9. The illumination system of claim 1, wherein said raster element has a torodial optical surface for producing said anamorphotic effect.

10. The illumination system of claim 9, wherein said taster element splits said light source into said tangential secondary light source and said sagittal secondary light source.

11. The illumination system of claim 9,
    wherein said raster element has a first radius of curvature in a first direction and a second radius of curvature in a second direction,
    wherein said field has a narrow field side and a longitudinally extended field side, and
    wherein said first radius of curvature is greater in a direction of said narrow field side than said second radius of curvature in a direction of said longitudinally extended field side.

12. The illumination system of claim 11, wherein said raster element is one of a plurality of raster elements, and wherein a distance between individuals of said plurality of raster elements in a direction of said narrow field side is not regular.

13. The illumination system of claim 1, wherein said raster element has a cylindrical optical surface for producing said anamorphotic effect.

14. The illumination system of claim 1, wherein said raster element is rectangular.

15. The illumination system of claim 1, wherein said aspect ratio of said field is greater than 2:1.

16. The illumination system of claim 1, wherein said aspect ratio of said field is greater than 13:1.

17. The illumination system of claim 1, further comprising:
    a field lens group having a field mirror or a field lens; and
    an exit pupil,
    wherein said field lens group produces an image of said sagittal secondary light source at said exit pupil to produce a tertiary light source.

18. The illumination system of claim 17, wherein said field mirror or field lens has an anamorphotic power.

19. The illumination system of claim 17, wherein said field mirror or field lens images said tangential secondary light source and said sagittal secondary light source at said exit pupil.

20. The illumination system of claim 17, wherein said raster element is one of a plurality of raster elements, wherein said tertiary light source is one of a plurality of tertiary light sources, and wherein said plurality of raster elements are positioned such that a predetermined distribution of said plurality of tertiary light sources is produced at said exit pupil.

21. The illumination system of claim 20, wherein said predetermined distribution comprises a regular grid or several grids displaced relative to one another.

22. The illumination system of claim 17, wherein said raster element is one of a plurality of raster elements, wherein said tertiary light source is one of a plurality of tertiary light sources, wherein individuals of said plurality of raster elements have different reflectivities, and wherein said reflectivities are such that a predetermined intensity distribution of said plurality of tertiary light sources is produced at said exit pupil.

23. The illumination system of claim 1, wherein said raster element is one of a plurality of raster elements, and wherein individuals of said plurality of raster elements have different reflectivities.

24. The illumination system of claim 23, wherein said field has a light distribution, and wherein said reflectivities are such that a uniform scanning energy distribution is produced.

25. The illumination system of claim 1, further comprising a second mirror or lens having a second raster element.

26. The illumination system of claim 25, wherein said second raster element has a cylindrical or toroidal optical surface.

27. The illumination system of claim 26, wherein said second raster element has a cylindrical optical surface and is situated at said sagittal secondary light source.

28. The illumination system of claim 25, wherein said second raster element is situated at said tangential secondary light source or said sagittal secondary light source, or between said tangential secondary light source and said sagittal secondary light source.

29. The illumination system of claim 25, wherein said second raster element images said raster element of said first mirror or lens.

30. The illumination system of claim 29, wherein said second raster element images at least one dimension or direction of said raster element of said first mirror or lens in said image plane.

31. The illumination system of claim 1, further comprising:
a field lens group having a field mirror or a field lens;
a diaphragm plane situated between said first mirror or lens and said field lens group; and
an exit pupil,
wherein said field mirror or field lens produces an image of said diaphragm plane at said exit pupil.

32. The illumination system of claim 31, wherein said diaphragm plane is situated at said sagittal secondary light source.

33. The illumination system of claim 31, wherein said diaphragm plane is situated at said tangential light source.

34. The illumination system of claim 31, wherein said diaphragm plane is situated between said tangential secondary light source and said sagittal secondary light source.

35. The illumination system of claim 1, wherein said raster element is one of a plurality of raster elements.

36. The illumination system of claim 35, wherein said plurality of raster elements are in a two-dimensional arrangement.

37. The illumination system of claim 25, wherein said second raster element is one of a plurality of second raster elements.

38. A projection exposure device for microlithography comprising:
the illumination system of claim 1;
a mask located at said image plane;
a light-sensitive object on a support system; and
a projection objective for imaging said mask onto said light-sensitive object.

39. A scanning system comprising the projection exposure device of claim 38.

40. A method for the production of a microelectronic component employing the projection exposure device of claim 38.

41. The illumination system of claim 35, wherein said plurality of raster elements is imaged into said plane, and wherein said images of said plurality of raster elements are at least partially superimposed on said field.

42. The illumination system of claim 1,
wherein said raster element is one of a plurality of raster elements,
wherein said tangential light source is one of a plurality of tangential light sources, and
wherein said sagittal light source is one of a plurality of sagittal light sources.

43. The illumination system of claim 1,
wherein said field has a narrow field side and a longitudinally extended field side, and
wherein said raster element is oriented parallel to said longitudinally extended field side.

44. An illumination system comprising:
a light source;
an optical component for transforming said light source into a secondary light source, wherein said optical component produces an anamorphotic effect that splits said secondary light source into a tangential secondary light source and a sagittal secondary light source, wherein said optical component has a first mirror or a first lens, having a raster element, and wherein said raster element is image d into an image plane;
a field lens group having a field mirror or a field lens;
a diaphragm plane situated between said first mirror or lens and said field lens group; and
an exit pupil,
wherein said field mirror or field lens produces an image of said diaphragm plane at said exit pupil.

45. An illumination system comprising:
a light source;
an optical component for transforming said light source into a secondary light source, wherein said optical component produces an anamorphotic effect that splits said secondary light source into a tangential secondary light source and a sagittal secondary light source, wherein said optical component has a first mirror or a first lens, having a raster element, and wherein said raster element is imaged into an image plane;
a field lens group having a field mirror or a field lens; and
an exit pupil,
wherein said field lens group produces an image of said sagittal secondary light source at said exit pupil to produce a tertiary light source.

46. An illumination system for illuminating a field with an first aspect ratio other than 1:1 in an image plane, said illumination system comprising:
an optical component for transforming a light source into a plurality of tangential secondary light sources and sagittal secondary light sources,
wherein said optical component has a first mirror having a plurality of reflective raster elements,
wherein said raster elements have toroidal optical surfaces,
wherein said raster elements have second aspect ratios that are smaller than said first aspect ratio, and
wherein said plurality of first raster elements are in a two-dimensional arrangement having a plurality of rows.

47. The illumination system of claim 46, wherein a tangential secondary light source is situated in said image plane.

* * * * *

UNITED STATES PATENT AND TRADEMARK OFFICE
CERTIFICATE OF CORRECTION

PATENT NO. : 6,507,440 B1
DATED : January 14, 2003
INVENTOR(S) : Jörg Schultz

It is certified that error appears in the above-identified patent and that said Letters Patent is hereby corrected as shown below:

Column 19,
Line 53, delete "taster" and replace with -- raster --

Column 22,
Line 13, delete "image d" and replace with -- imaged --

Signed and Sealed this

Fourth Day of May, 2004

JON W. DUDAS
*Acting Director of the United States Patent and Trademark Office*